United States Patent
Gu et al.

(10) Patent No.: US 7,871,587 B2
(45) Date of Patent: Jan. 18, 2011

(54) REACTIVE CHEMICAL CONTAINMENT SYSTEM

(75) Inventors: Youfan Gu, Superior, CO (US); Paul Dozoretz, Hudson, CO (US)

(73) Assignee: MKS Instruments, Inc., Boulder, CO (US)

( * ) Notice: Subject to any disclaimer, the term of this patent is extended or adjusted under 35 U.S.C. 154(b) by 0 days.

(21) Appl. No.: 12/645,455

(22) Filed: Dec. 22, 2009

(65) Prior Publication Data

US 2010/0166630 A1 Jul. 1, 2010

Related U.S. Application Data

(60) Provisional application No. 61/140,609, filed on Dec. 23, 2008.

(51) Int. Cl.
*B01D 53/38* (2006.01)
*B01D 53/68* (2006.01)
*B01D 53/76* (2006.01)

(52) U.S. Cl. .......... 423/210; 422/129; 422/168; 422/169; 422/170; 422/171; 422/176; 422/178; 422/183

(58) Field of Classification Search ........... 423/210; 422/129, 168–171, 176, 178, 183
See application file for complete search history.

(56) References Cited

U.S. PATENT DOCUMENTS

| | | | |
|---|---|---|---|
| 4,029,636 A | | 6/1977 | Lowry et al. |
| 4,544,350 A | | 10/1985 | Ware, III et al. |
| 4,555,389 A | * | 11/1985 | Soneta et al. ............ 423/210 |
| 5,603,905 A | * | 2/1997 | Bartz et al. ............ 422/173 |
| 5,707,410 A | | 1/1998 | Puls |
| 5,779,991 A | | 7/1998 | Jenkins |
| 6,029,440 A | | 2/2000 | Dullian |
| 6,084,148 A | | 7/2000 | Shiban et al. |
| 6,234,787 B1 | | 5/2001 | Endoh et al. |
| 6,922,891 B1 | | 8/2005 | Marino, Jr. |
| 6,926,873 B1 | | 8/2005 | Filippi et al. |
| 7,033,550 B2 | | 4/2006 | Kanno et al. |
| 2001/0007648 A1 | * | 7/2001 | Schumacher ............ 423/210 |
| 2007/0098612 A1 | * | 5/2007 | Lord .................. 423/215.5 |

OTHER PUBLICATIONS

International Search Report for PCT/US09/069329, International Searching Authority, May 25, 2010, pp. 1-24.

* cited by examiner

*Primary Examiner*—Timothy C Vanoy
(74) *Attorney, Agent, or Firm*—James R. Young; Cochran Freund & Young LLC

(57) ABSTRACT

A small scale, but effective, reactive chemical containment system includes apparatus and methods for reaction of process gases exhausted from reaction furnaces with a reactant gas in a non-combustible manner to produce and contain particulate or powder byproducts, thereby removing the process gas from the exhaust gas flow. The apparatus provides process gas inlet, treatment reactive gas diffusion, process gas and treatment reactive gas pre-mixing, primary containment, secondary containment, and outlet zones.

85 Claims, 17 Drawing Sheets

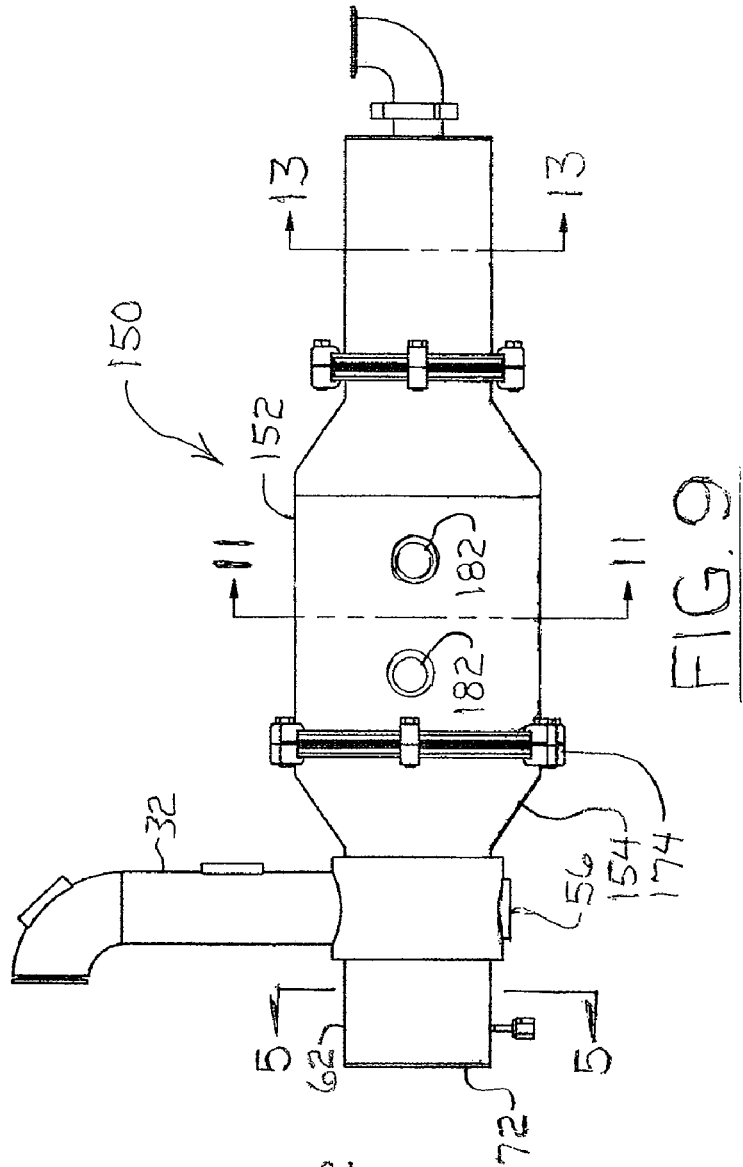
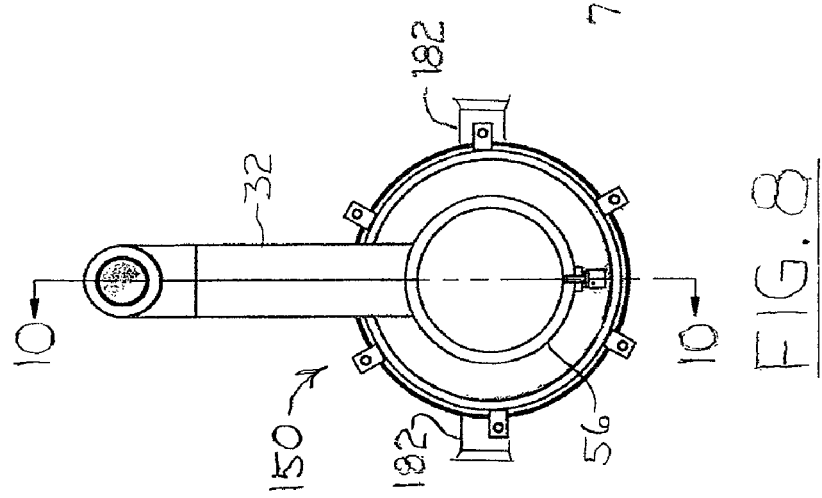

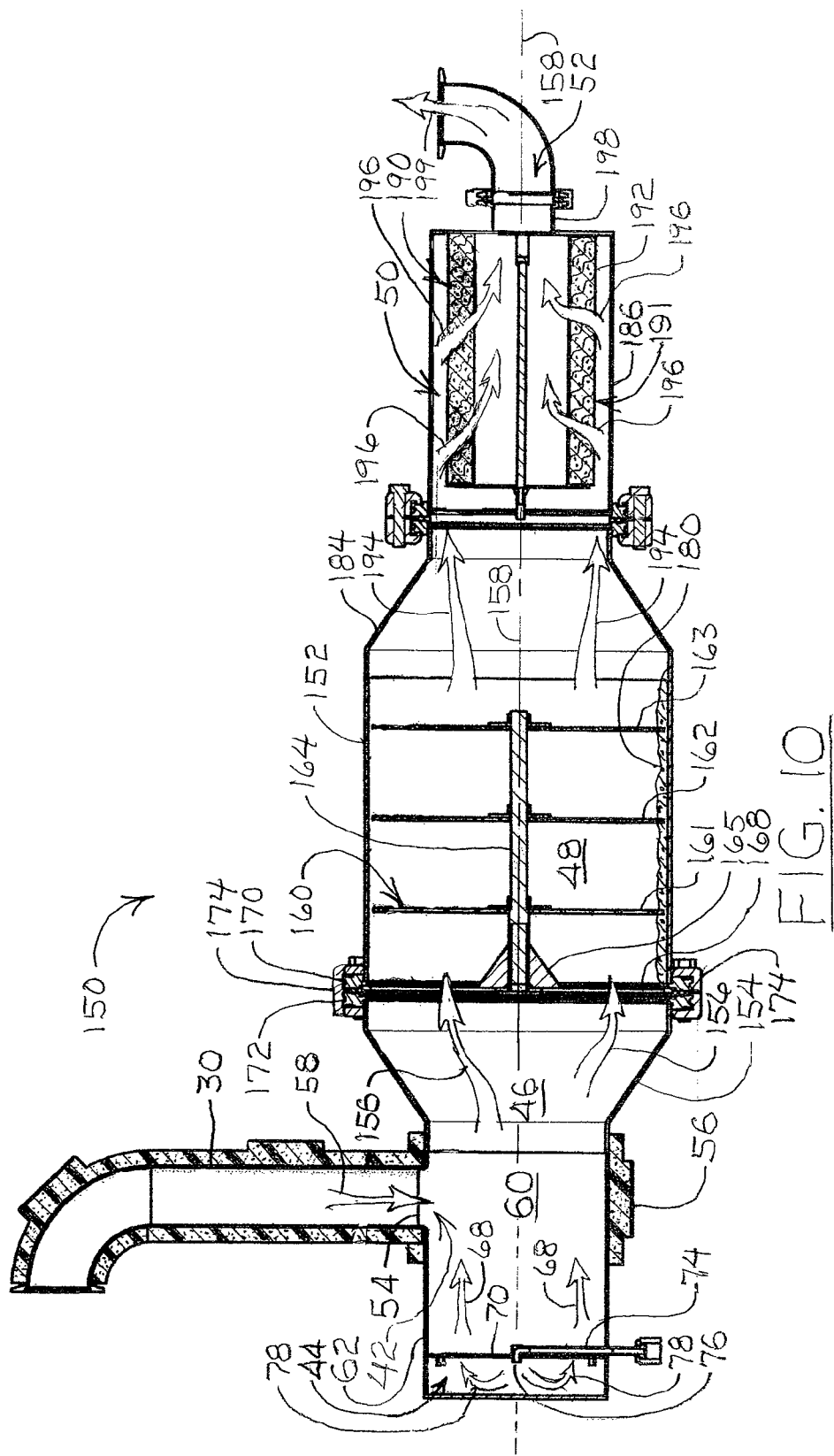

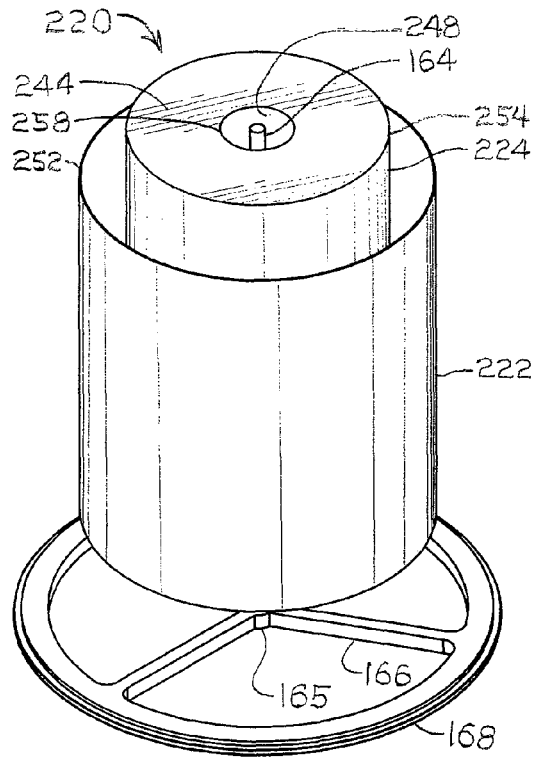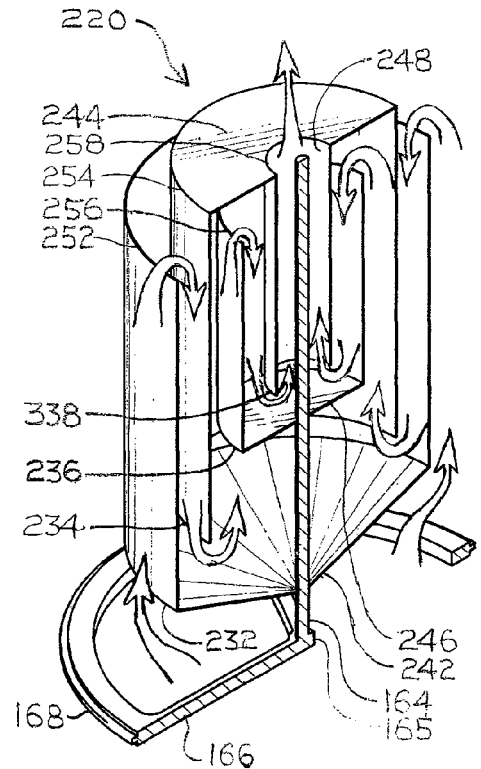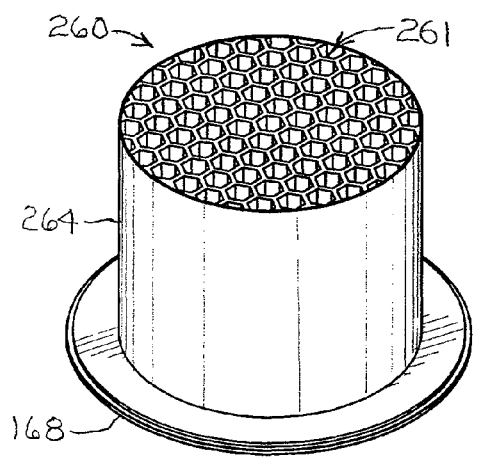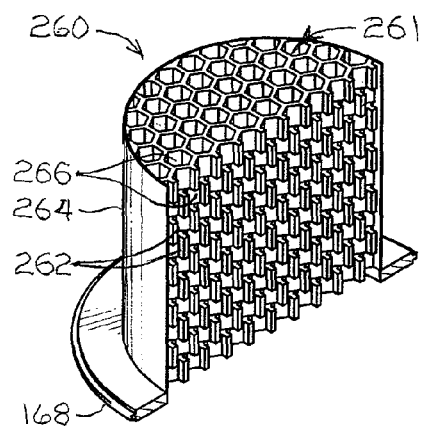

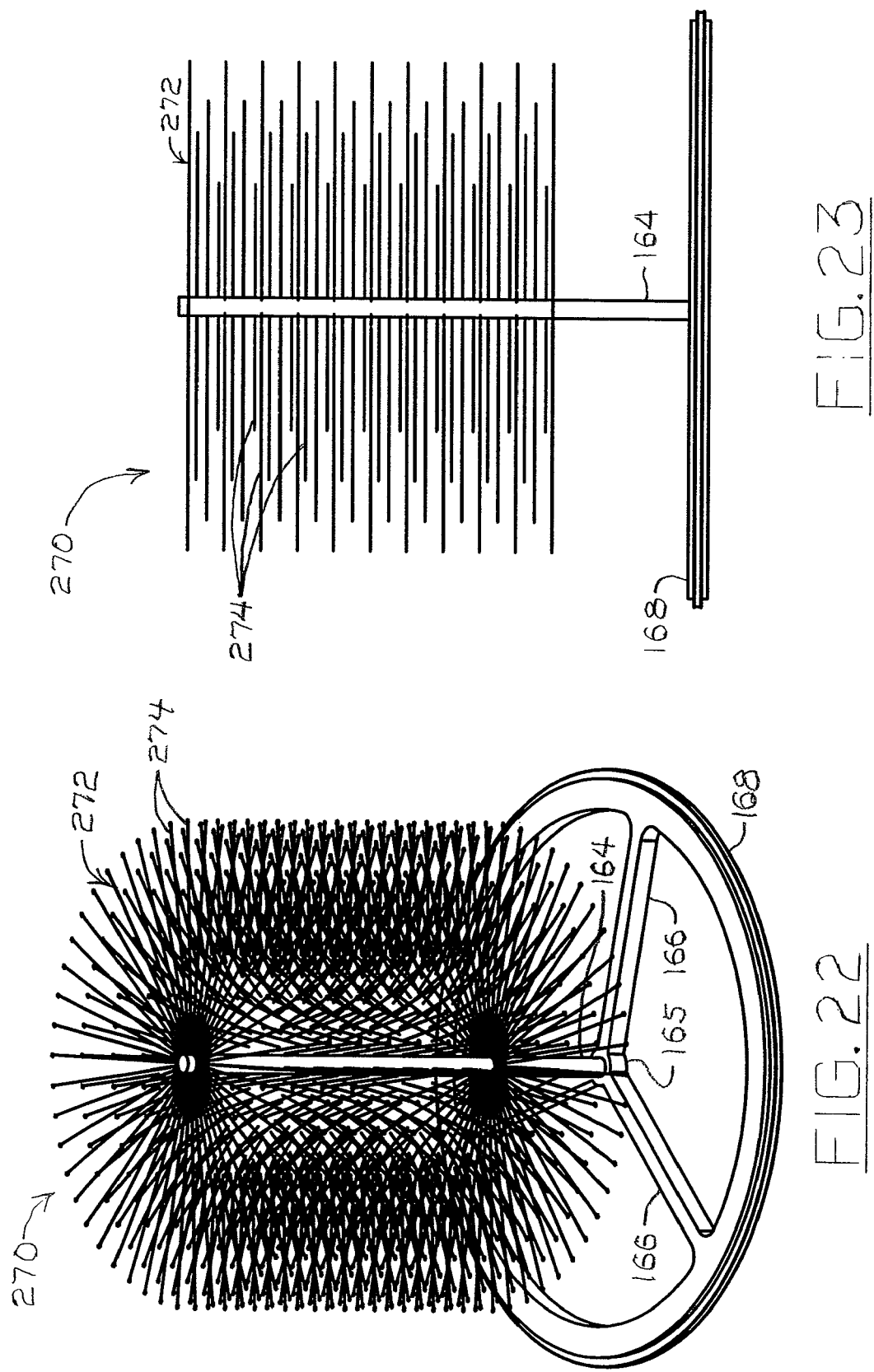

REACTIVE CHEMICAL CONTAINMENT SYSTEM

CROSS-REFERENCE TO RELATED APPLICATIONS

This invention features the benefit of U.S. provisional application No. 61/140,609, filed on Dec. 23, 2008.

BACKGROUND OF THE INVENTION

1. State of the Prior Art

The present invention is related to methods and apparatus for capturing and retaining reactive chemical constituents of industrial processes that do not get reacted in thin-film semiconductor deposition reaction chambers, including, but not limited to, wet and dry scrubbers, traps, catch pots, and reactors.

2. State of the Art

Myriad thin film deposition systems, including those used for depositing thin films of a variety of semiconductor materials on substrates or devices, use selected reactive process gases to cause chemical reactions in reaction chambers that result in deposition of a desired thin film material on the substrate or device. In such systems, it is typical to feed and flow more of the reactive process gas or gases into and through the reaction chamber than actually gets reacted or consumed in the deposition process in order to maintain good thin film uniformity, so substantial amounts of the reactive process gas or gases flow out of the reaction chamber and into the exhaust system. Some of the commonly used reactive chemical process or feed gases, such as silane and other silicohydride gases, arsine, phosphine, germane, and others used in deposition systems for depositing or epitaxially growing various thin film materials are toxic, pyrophoric, or polluting, thus dangerous or undesirable in the exhaust system and/or in the atmosphere. Therefore, there has been a long recognized need for effective and efficient methods and apparatus or systems for handling such reactive chemical process gases in reaction chamber exhaust systems and for preventing them from escaping into the atmosphere.

As a particularly relevant example, silicohydride gases, e.g., silane ($SiH_4$), disilane ($Si_2H_6$), and other silicohydride gases are highly reactive, pyrophoric, and toxic process gas chemicals used in various epitaxial growth and other deposition systems, including low pressure chemical vapor deposition (LPCVD), atmospheric pressure chemical vapor deposition (APCVD), plasma enhanced chemical vapor deposition (PECVD), hot wire deposition (HWD), and others, for depositing thin films comprising silicon, such as crystalline silicon (c-Si), polycrystalline silicon (p-Si), amorphous silicon (a-Si), silicon dioxide ($SiO_2$), silicon nitride (SiN), and others. Silane, disilane, and other silicohydride gases are so reactive because the Si—H bond energy is low and the bonding of Si—Si chains is unstable. Typical current solutions for dealing with silane and other silicohydride process gases in the exhaust gases from such reaction chambers include various kinds of wet and dry scrubbers, which are very expensive, conventional traps and catch pots, which are only marginally helpful, or simply dumping the silicohydride process gases into house exhaust systems and expelling it to the atmosphere, which is dangerous and has undesirable pollution effects. For example, silicohydride gas exhausted into the atmosphere results in spontaneously produced micro-particles of silicon dioxide, which can be inhaled and lodged in people's lungs to cause health problems.

Both dry and wet scrubbers typically involve large and expensive capital equipment installations that discourage use, especially in countries that do not regulate effectively against exhausting silane into the atmosphere. Where regulations are not enforced or are ineffective, the availability of smaller, more efficient, and less expensive silane exhaust mitigation would make more voluntary mitigation or compliance feasible, and where such regulations are enforced, smaller, more efficient, and less expensive alternatives to conventional scrubbers would be helpful.

When a scrubber is installed to treat silane or other silicohydride gas exhausted from a low pressure chemical vapor deposition (LPCVD) process, an exhaust line is required to connect the outlet of the vacuum pump that is used to evacuate the LPCVD reaction chamber to the scrubber. For some LPCVD processes, such as silicon nitride deposition by plasma enhanced chemical vapor deposition (SiN PECVD), condensable solid byproducts are formed and will form in the exhaust line and clog the exhaust line if not prevented. Therefore, a heated exhaust line is required to keep the byproducts in the vapor phase to prevent the exhaust line from being clogged. For other processes involving large amounts of silane in the exhaust line, solid silicon dioxide ($SiO_2$) byproducts may be formed. If water vapor is involved (which can back-stream into the exhaust line from a wet scrubber), these byproducts can stick quite strongly to the inside walls of the exhaust line, even if the exhaust line is heated. Therefore, frequent preventative maintenance, including disassembly of the exhaust line, may be required to clean out the accumulated solids before they clog the exhaust line. Also, the exhaust line may have to be very long to reach the scrubber in some installations and can be very complex, especially at the scrubber inlet, which requires not only many expensive pipe heaters, but also complex shaped, thus even more expensive, pipe heater components.

In-situ cleaning of the deposition process chamber is also quite common, where, for example, fluorine based chemicals, such as $NF_3$, are often used to generate reactive atomic fluorine to convert solid deposition on the walls and equipment components inside the process chamber (e.g., $SiO_2$ or Si) into gaseous compounds (e.g., $SiF_4$) that can then be flushed out of the process chamber. To treat such halogen gases, a wet scrubber is most effective, whereas for treating silane, a dry scrubber is most effective. Therefore, either multiple scrubbers or multiple stage scrubbers with both wet and dry stages may be used to destroy different types of chemicals selectively and effectively.

As mentioned above, such conventional dry and wet scrubber systems are typically large, expensive, and not very efficient. They require a lot of space, so they cannot always be placed close to the reaction chambers and often require long runs of heated pipes, which is also expensive. There have been some attempts to provide smaller silane exhaust gas abatement, including, for example, reacting the silane with halogen to produce halosilanes that are hydrolyzed in water (U.S. Pat. No. 6,086,838, issued to Morgan), sorbent resin beds (U.S. Patent Application Publication US2005/0089455 A1 by Morganski et al.), and non-thermal, corona discharge dissociation reactors (U.S. Pat. No. 6,576,573, issued to Arno). However, more recent increases in demand for flat panel television and other displays and for solar cells have lead to large scale manufacturing of those devices. Such large scale, flat panel display and solar cell manufacturers flow significantly more silane than more conventional semiconductor processes. The current scrubber technology is ill-equipped to handle such drastically increased silicohydride exhaust gas loads, and more frequent and expensive preventative maintenance, unclogging, and cleanout cycles are now often required. Moreover, those manufacturers that, in the past, have gotten by with flowing their silicohydride laden exhaust gases directly into their house exhaust systems to avoid the capital expenditures and maintenance costs of scrubber systems are now finding that such larger gas loads are creating clogging of exhaust lines with solid silicon dioxide deposits and safety and environmental hazards.

BRIEF DESCRIPTION OF THE DRAWINGS

The accompanying drawings, which are incorporated herein and form a part of the specification, illustrate some, but not the only or exclusive, example embodiments and/or features. It is intended that the embodiments and figures disclosed herein are to be considered illustrative rather than limiting.

In the drawings:

FIG. 8 is a front end elevation view of the example reactive chemical containment apparatus of FIG. 7;

FIG. 9 is a side elevation view of the example reactive chemical containment apparatus of FIG. 7;

FIG. 10 is a cross-sectional view of the example reactive chemical containment apparatus taken along section line 10-10 in FIG. 8;

FIG. 18 is an isometric view of an example alternative primary insert comprising a labyrinth of cylindrical barrels;

FIG. 19 is an isometric, cross-sectional view of the example primary insert in FIG. 18;

FIG. 20 is an isometric view of an example alternative primary insert comprising a stack of offset honeycomb elements;

FIG. 21 is an isometric cross-sectional view of the example primary insert in FIG. 20;

FIG. 22 is an isometric view of an example alternative primary insert comprising a brush-like structure;

FIG. 23 is a side elevation view of the example primary insert in FIG. 22;

DETAILED DESCRIPTION OF EXAMPLE EMBODIMENTS

An example reactive chemical containment device 10 is shown diagrammatically in FIG. 1 in the exhaust system of a typical thin film deposition system as one example implementation of the invention, but recognizing that the invention as recited in the features below can also be implemented in other ways with myriad variations in details, once the principles of the invention are understood from the description herein. This example implementation of the reactive chemical containment device 10 is shown in the isometric view in FIG. 2 with several visual cut out portions of the exterior housing and external components to reveal internal components for convenience, whereas the side elevation view of the device 10 in FIG. 3 conceals the internal components but provides the visual orientations 4-4 and 5-5 for the cross-sectional views in FIGS. 4 and 5, respectively.

Figure 1:
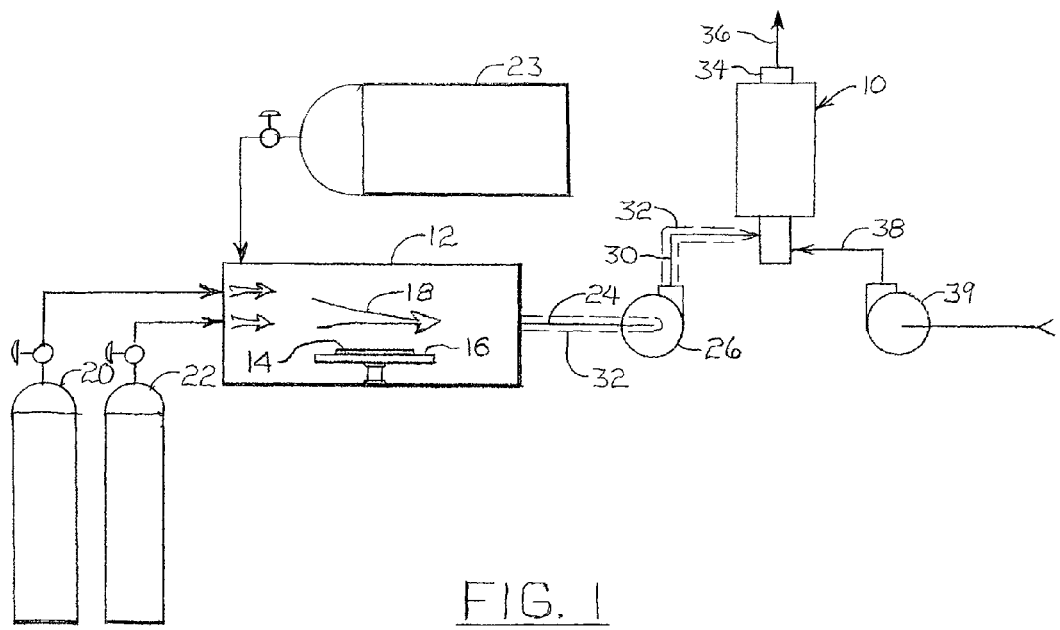
FIG. 1 is a diagram of a thin film deposition system with reactive chemical containment according to this invention downstream from the thin film deposition reaction chamber.

With reference first to FIG. 1, a typical thin film deposition reaction chamber 12 is shown with a substrate 14 positioned on a platform 16 in the chamber 12 for depositing on the substrate 14 a thin film of a material 15 derived from a flow of chemical reactive process gas or gases depicted by the flow arrow 18. For clarity and ease of explanation, this invention for reactive chemical containment can be described in the context of a common plasma enhanced chemical vapor deposition (PECVD) of silicon nitride ($Si_3N_4$), often known in the industry as "PECVD nitride" for short. This example is apt because PECVD nitride is currently being used in large scale, flat panel display and solar cell production processes, where, because of the large sizes of the panels, massive quantities of silane are flowed through the reaction chambers 12 and exhausted. However, the principles and benefits of this invention can also be used with exhaust from other deposition processes, such as other high pressure and low pressure chemical vapor deposition, hot wire dissociation deposition, atomic layer deposition (ALD), or other processes where excessive reactive chemicals are involved. It can also be used with different reactive process gases, especially other pyrophoric gases, such as disilane and other silicohydride gases, arsine, phosphine, germane, or tungsten hexafluoride, for depositing thin films of silicon dioxide, polycrystalline silicon, polycrystalline germanium, tungsten, or others. In FIG. 1, the feed gas source tank 20 represents any of such reactive, pyrophoric gases, and the feed gas source tank 22 represents any other constituent gas or combination of gases required for a desired reaction to produce a desired material deposition. For example, in the PECVD nitride deposition used in this explanation, the other process gas for the reaction with silane to deposit silicon nitride may be, for example, nitrogen ($N_2$) or ammonia ($NH_3$). These processes may also include some inert carrier gas or dilution gas, which is represented by the source tank 23 in FIG. 1, as is well-known to persons in the art.

As mentioned above, significantly large quantities of unreacted silane (or other reactive process gas) flows through and out of the reaction chamber 12, while some amount of the silane (or other reactive process gas) is reacted in the reaction chamber 12 to produce a thin film 15 of silicon nitride or other desired material on the substrate 14. From this point in the explanation, only silane process gas will be mentioned explicitly in order to avoid cumbersome repetition of all the reactive process gases mentioned above, but with the understanding that any of the reactive process gases mentioned above could be considered in the same or similar context and that neither this example nor the invention is limited to silane.

The unreacted silane process gas flows out of the reaction chamber 12 and through a pipe 24 (sometimes called a foreline in vacuum or low pressure CVD systems), through the vacuum pump 26, and into another pipe 30 (sometimes called the exhaust pipe or exhaust line). The foreline 24 and/or exhaust line 30 may be maintained at an elevated temperature by pipe heaters 32, which are well known to persons skilled in the art. Such pipe heaters are often used to prevent the silane process gas and/or their byproducts from sublimating to a solid in the foreline 24 and/or exhaust line 30. In atmospheric or higher pressure deposition systems, there might not be a vacuum pump. Also, in some deposition systems there might be a trap or specialized secondary reactor of some kind (not shown) installed in the foreline 24 before the vacuum pump 26 or in the exhaust line 30 after the vacuum pump 26.

The reactive chemical containment system apparatus or device 10 is shown in FIG. 1 connected to the exhaust line 30 downstream from the vacuum pump 26, where it treats and contains the silane gas flowing in the exhaust gases from the reaction chamber 12 by reacting the silane process gas with enough of another reactant gas or gas mixture to consume all of the process silane. For example, silane ($SiH_4$) reacted with oxygen ($O_2$) produces silicon dioxide ($SiO_2$), which is a chemically stable solid. The remaining gases continue flowing out of an outlet 34 of the device 10 and through the downstream exhaust line segment 36 to the house exhaust system (not shown) or directly to the atmosphere or to some other treatment or disposal system. The other reactant gas, for example, oxygen is introduced into the device 10 as indicated by the feed line 38. If air is used as the source of oxygen, it can be compressed dry air (CDA) represented diagrammatically by the air pump 39, or it can be provided from a compressed air tank (not shown) or in any other convenient manner. When such a device 10 is used with a tungsten CVD process, the other reactant gas may comprise water vapor ($H_2O$) to turn tungsten hexafluoride ($WF_6$) into solid tungsten oxides (e.g., $WOF_4$, $WO_2F_2$, or $WO_3$). For clarity of terms in this explanation and to avoid confusion, the unreacted silane and other reactive gases from the primary reactor 12 will be called a process gas, silane process gas, or process silane, and the other reactant (e.g., oxygen, air, water vapor, or other reactive gas) introduced by the feed line 38 into the device 10 for reaction with the silane will be called the treatment reactive gas.

Figure 2:
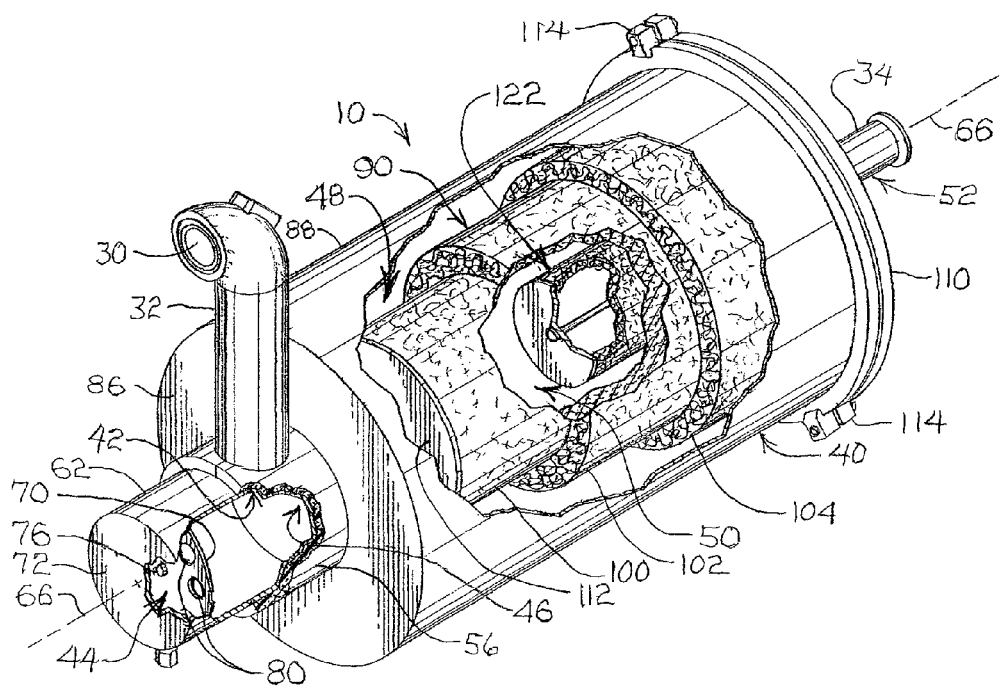
FIG. 2 is an isometric view of an example reactive chemical containment apparatus for the system described herein with several portions of the exterior structure and of internal containment elements shown cut away to reveal some of the interior components.

Referring now to FIG. 2, the reactive chemical containment system apparatus or device 10 has a housing 40 that encloses six functional zones: (i) An entry zone 42, which is provided to maintain the incoming gases, including the unreacted silane process gas, in homogenous gas phase, and it can be heated if necessary with a heater (e.g., heaters 32 and 56) to keep the temperature of the inflowing process gas above the vapor threshold; (ii) A diffusion zone 44 in which a treatment reactant gas (e.g., oxygen or compressed dry air) is allowed to diffuse into a volume that normalizes its concentration gradient; (iii) A pre-mixing zone 46, which has a larger cross-sectional area than the entry zone 42 to reduce gas flow velocity and promote mixing of the process silane and the treatment reactive gas without turbulence to avoid reaction as much as possible in the mixing zone; (iv) A primary containment chamber 48, which is larger in volume than the pre-mixing zone 46 and includes apparatus for enhancing conditions that promote reaction of the reactive process gas with the treatment reactant gas to force a reaction that eliminates the reactive process gas and produces more benign reaction byproducts, which would otherwise occur naturally farther downstream, for example in the inlet of a scrubber or the entrance to a house exhaust system, where they would impede or block gas flow and cause frequent maintenance problems; (v) A secondary containment zone 50 for reacting any process silane and treatment reactive gas that was not reacted in the primary containment zone 48; and (vi) An exit zone 52 that connects the secondary containment zone 50 to the exhaust piping 36 that leads to a house exhaust system (not shown) or, in some circumstances, to a house scrubber (not shown).

Figure 4:
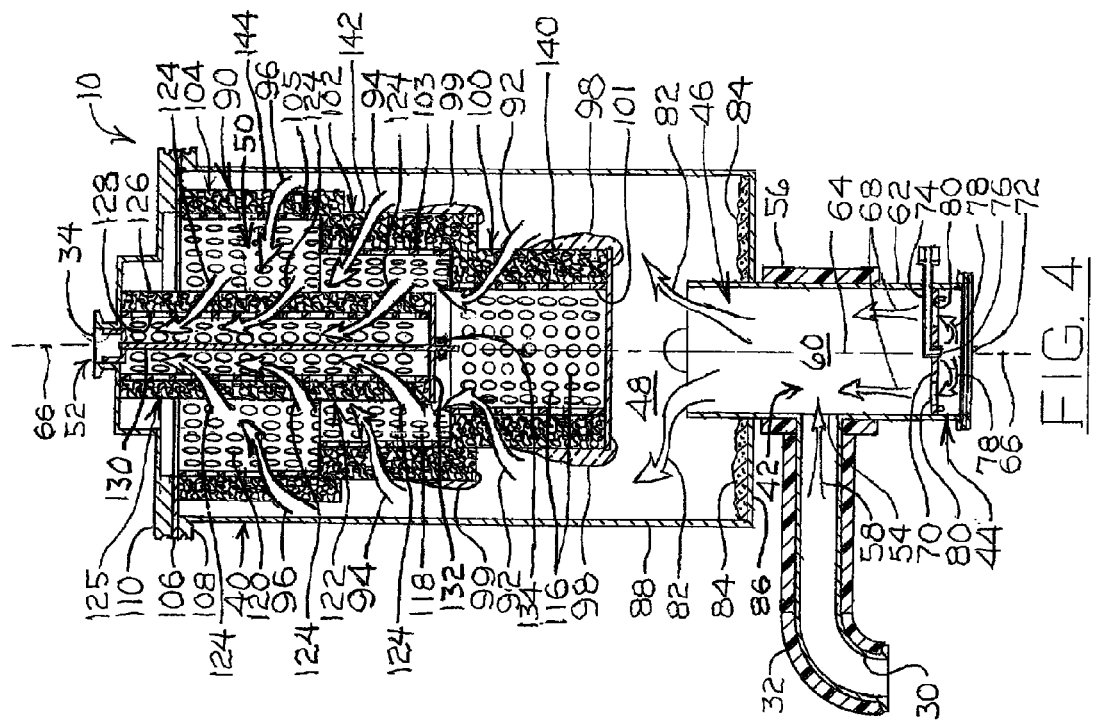
FIG. 4 is a cross-sectional view of the reactive chemical containment apparatus taken along section line 4-4 in FIG. 3.
Figure 3:
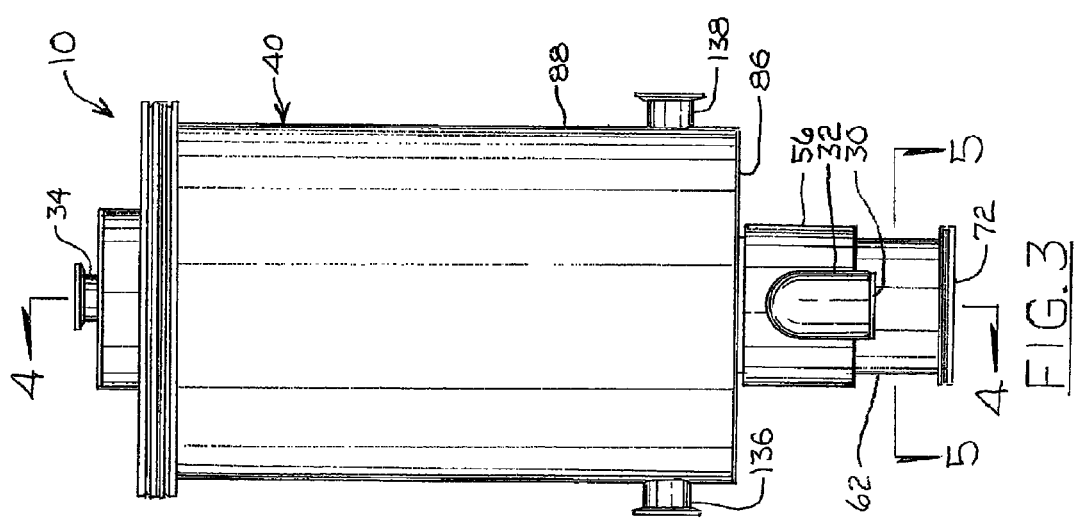
FIG. 3 is a side elevation view of the example reactive chemical containment apparatus of FIG. 2.
Figure 5:
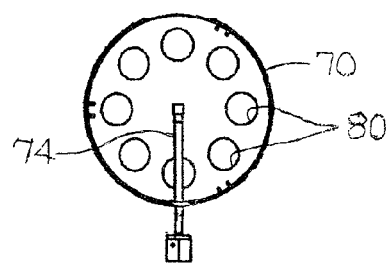
FIG. 5 is a cross-sectional view of the reactive chemical containment apparatus taken along section line 5-5 in FIG. 3.

Referring now primarily to FIGS. 2 and 4 with secondary reference to FIGS. 1 and 3, the process gas or gases, including unreacted process silane, along with reaction byproducts and any carrier or dilution gas, from the reaction chamber 12, are transported by the foreline 24 and exhaust piping 30 (FIG. 1) to the reactive chemical containment device 10, where the exhaust piping 30 is connected to the inlet opening 54 of the device 10 (FIGS. 2 and 4). The entry zone 42 mentioned above comprises the zone where the exhaust piping 30 directs the process gas flow into the inlet opening 54, as indicated by flow arrow 58 (FIG. 4).

For efficiency in handling and treating the process silane in the reactive chemical containment device 10, it is preferable to introduce the process silane into the device 10 as soon as practical after it flows out of the primary reaction chamber 12, so ideally the vacuum pump 26 and device 10 would be positioned right next to the primary reaction chamber 12 so that the outlet of the primary reaction chamber 12 would flow directly into the inlet of the vacuum pump 26, and the outlet discharge of the vacuum pump 26 would flow directly into the inlet opening 54 of the device 10. However, because of space limitations and other considerations in practical applications, it is usually necessary to have some space or distance between the primary reaction chamber 12 and the vacuum pump 26 as well as between the vacuum pump 26 and the device 10. Therefore, to prevent clogging in the foreline 24 and in the exhaust line 30 leading to the device 10, it is preferred to keep the process silane and other process gases in vapor phase to flow from the primary reaction chamber 12 to the device 10 without sublimation to a solid. Therefore, the pipe heater 32 is an option that can be used on the exhaust pipe 30 between the vacuum pump 26 and the device 10 to help maintain the process silane and other process gases in the vapor phase. A similar heater 56 or some other heat source can be provided around the pre-mixing chamber 60, if desired, to help keep the process silane and other process gases in vapor phase and prevent sublimation as they are being mixed with treatment reactive gas, e.g., oxygen or air, water vapor, etc. as will be described below.

The pre-mixing chamber 60, which includes the pre-mixing zone 46, is enclosed by a pre-mixing chamber housing 62, which can, but does not have to, be an elongated cylindrical shape, as shown in FIGS. 1-4. The process gases 58 flow into the pre-mixing chamber 60 in the example device 10 transverse to the longitudinal axis 64 of the pre-mixing chamber 60, but other orientations would also work. The pre-mixing chamber 60 can, but does not have to, be coincident with the longitudinal axis 66 of the device 10. The process gas or gases 58 mix with the treatment reactive gas flowing, as indicated by flow arrows 68, from the diffusion zone 44 of the pre-mixing chamber 60. As indicated above, the cross-sectional area of the pre-mixing zone 46 of the pre-mixing chamber 60 is larger than the cross-sectional area of the exhaust pipe 30 to promote thorough mixing of the process silane with the treatment reactive gas in the pre-mixing zone 46.

As also mentioned above, the diffusion zone 44 of the pre-mixing chamber 60 is provided to allow the treatment reactive gas to be distributed more evenly and uniformly before entering the pre-mixing zone 46. In addition, it should be located far enough away from or lower than the entry zone 42, i.e., inlet opening 54, to avoid flow or diffusion of the process gases into the diffusion zone 44, where the process gases could react with the treatment reactive gas and clog the nozzle 76 or diffusion apertures 80 in the diffusion zone 44.

Figure 6:
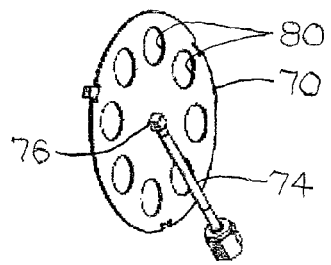
FIG. 6 is an isometric view of the diffusion components of the reactive chemical containment apparatus.

As best seen in FIGS. 2 and 4, a diffuser plate 70 (also shown in FIGS. 5 and 6) is positioned transversely across the pre-mixing chamber 60 between the front end wall 72 of the pre-mixing chamber housing 62 and the process gas inlet 54. A treatment reactive gas injection tube 74 terminates in a nozzle 76 extending axially through the diffuser plate 70 to inject the treatment reactive gas into a space between the diffuser plate 70 and the front end wall or cap 72. The treatment reactive gas then is forced by the end wall or cap 72 to turn 180 degrees, as indicated by flow arrows 78 in FIG. 4, to flow through the apertures 80 in the diffuser plate 70 and into the mixing zone 46 of the pre-mixing chamber 60, as indicated by the flow arrows 68 in FIG. 4.

The diffuser plate 70 positioned between the treatment reactive gas inlet nozzle 76 and the process gas inlet opening 54 reduces the potential diffusion of the process gases into the diffusion zone 44 or the vicinity of the reactive gas inlet nozzle 76, where reaction of the process gas with the treatment reactive gas could form solid byproducts and clog the treatment reactive gas inlet nozzle 76. The diffuser plate 70 can also catch and retain solid byproducts from reaction of the process gas with the treatment reactive gas in the pre-mixing zone 46 and in the primary containment zone 48 that fall by gravity from the pre-mixing zone 46 and primary containment zone 48 toward the diffusion zone 44, where such solids could otherwise accumulate and clog the inlet nozzle 76.

Of course, myriad other diffuser implementations could be used to achieve diffusion of the treatment reactive gas uniformly across the cross-section of the pre-mixing chamber 60, such as a plurality of nozzles (not shown), a mesh, screen, or perforated diffuser plate (not shown), which persons skilled in the art would be able to devise, once they understand the principles and purpose for the diffuser zone 44. Also, the diffuser plate 70 does not have to be flat. For example, a conical diffuser plate 70 (not shown) can cause solid particles of silicon dioxide or other reaction byproducts falling from the pre-mixing zone 44 or from the primary containment zone 48 onto the conical plate 70 to roll or slide either to the periphery away from the inlet nozzle 76 or to the center above the inlet nozzle 76, depending on how the conical diffuser plate 70 is oriented. It is advantageous to diffuse the treatment reactive gas into the pre-mixing zone 46 uniformly across the cross-sectional area of the pre-mixing chamber 60 to achieve thorough mixing with the process gas in the pre-mixing zone 46, thus enhancing the probability of gas molecule collisions and resulting efficiency of chemical reactions in the primary containment zone 48.

The cross-sectional area of the pre-mixing zone 46, while larger than the pipe 30 and inlet 54, is still small enough, and the volume of the pre-mixing zone 46 is small enough, that the combined and mixed silane process gas and the treatment reactive gas moves quickly from the pre-mixing zone 46 in the pre-mixing chamber 60 to the primary containment chamber 48, as indicated by flow arrows 82, to minimize any reaction between the silane process gas and the treatment reactive gas in the pre-mixing chamber 60. Due to the relatively large, straight flow path, there is negligible turbulence in the pre-mixing zone 46, so formation of byproducts from reaction of process gas and treatment reactive gas is minimal, which minimizes any tendency to clog the process gas inlet opening 54 and thereby prolongs service life between planned maintenance intervals. The goal for the device 10 is to have negligible reaction of the silane process gas with the treatment reactive gas in the diffusion zone 44, to achieve mixing of the silane process gas and the treatment reactive gas in the pre-mixing zone 46 with as little reaction as possible, and as much reaction as possible in the larger primary containment chamber 48, where the resulting solid reaction byproduct (e.g., $SiO_2$, when silane is reacted with oxygen as the treatment reaction gas) can settle and be trapped. Of course, that goal may not be one hundred percent achievable, but the device 10 can approach that goal.

Unlike conventional dry scrubbers in which the silane is mixed with oxygen and ignited to combust the silane, the concentration of the silane and the treatment reactive gas (e.g., oxygen) in the pre-mixing chamber 60 and in the primary containment chamber 48 in the device 10 is low enough that the mixture does not combust in either the mixing zone 46 or in the primary containment chamber 48. This principle works in this application, because the process gases, including those mentioned above, are extremely reactive. Therefore, the device 10 can operate to react the silane and treatment reactive gas (e.g., oxygen) at room temperature and with no need for electronic controls for igniting or controlling combustion or incineration of the silane as is often required in conventional dry scrubbers.

As the mixed silane process gas and treatment reactant gas flow into the larger primary containment chamber 48, as indicated by the flow arrows 82, the flow velocity slows because of the larger volume, and continued reaction of the process silane and solidification of a substantial portion of the byproduct does occur in the primary containment chamber 48. The resulting solid product 84 of the reaction (e.g., $SiO_2$) settles to the bottom of the primary containment chamber 48, which, in the example implementation shown in FIG. 4, is formed by the end wall 86 of the cylindrical housing 88 that encloses the primary containment chamber 48. The large volume of the primary containment chamber 48 is provided to have space to accumulate substantial quantities of the solid byproducts between planned maintenance cycles and to accommodate a large enough primary insert 90 to provide the functions and capacities discussed herein. As also mentioned above, when the reactive chemical containment device 10 is operated with its longitudinal axis oriented vertically, a small portion of the solid byproducts from the reaction in the primary containment chamber 48 will fall by gravity through the pre-mixing zone 48, but the diffuser plate 70 prevents such byproducts from clogging the reactive gas inlet nozzle 76.

The rest of the gas mixture that does not react immediately upon entering the primary containment chamber 48 continues to flow through the primary containment chamber 48 to the primary insert 90. The primary insert 90 is positioned in the primary containment chamber 48 between the mixing chamber 60 and the outlet 30 so that all of the mixed gases have to flow through this primary insert, as indicated by the flow arrows 92, 94, 96 in FIG. 4. The primary insert 90 comprises material or components that maximize reaction efficiency by creating turbulence in the gas flow 92, 94, 96 without occupying significant volume itself so that it does not inhibit conductance of the gas flow through the device 10, i.e., it does not inhibit the gas flow enough to prevent the vacuum pump 26 (FIG. 1) from achieving or maintaining a desired pressure in the primary reaction chamber 12 (FIG. 1). In addition, the large surface of the primary insert 90 slows down the gas flow velocity and increases the resident time for the gas molecules in the primary containment chamber 48, which not only enhances the chemical reaction efficiency, but also provides more time for the chemical reactions to occur in the primary containment chamber 48.

In the example implementation shown in FIGS. 2 and 4, the primary insert 90 comprises stainless steel, crimped wire mesh, but other materials and structures can also be used to serve the desired function. By enhancing or forcing the reaction of the silane process gas with the treatment reactive gas in the primary insert 90, the silane is consumed in the device 10 instead of in more undesirable places, such as in a scrubber inlet (not shown) or in an entrance to a house exhaust system (not shown). As the gaseous mixture passes through the primary insert 90, the process silane and the treatment reactive gas in the mixture react with each other chemically to produce a solid product of the reaction. For example, when silane ($SiH_4$) reacts with oxygen ($O_2$) in the treatment reaction gas, the resulting product is solid silicon dioxide according to the reaction equation:

$$xSiH_4 + yO_2 \rightarrow zSiO_2 \tag{1}$$

The solid product (e.g., $SiO_2$) of the reaction in the primary containment chamber 48 is in the primary containment chamber 48 very fine particulate matter or powder, and, for the most part, the fine particulate or powder byproducts are retained in the primary insert 90 material or structure (e.g., mesh), where it builds up and eventually clogs the primary insert 90, as indicated diagrammatically by the build-up 98, 99 in FIG. 4. However, since the silicon dioxide byproduct is so fine, some of it can be carried farther downstream, where secondary insert 122 can catch and retain it. Therefore, the secondary insert 122 enhances the overall efficiency of the device 10 not only by enhancing further reaction of theretofore unreacted process gas, as explained below, but also by catching and retaining particulate or powder byproduct that escapes or gets through the primary insert 90. Of course, other reaction byproducts from other materials may condense or form in a very dense build-up on the surfaces of the mesh or other medium in the element 125 of the primary insert 90.

Because of natural gas flow patterns, the solid build-up 98, 99 tends to occur first in the front (upstream) portions of the primary insert 90, where the gaseous mixture of reactants first meets the primary insert 90. As those portions of the primary insert 90 become more and more occluded from the solid build-up 98, 99, the flow of the gaseous mixture gradually shifts to less occluded portions of the insert 90 farther downstream. Eventually, the solid build-up will occlude enough of the primary insert 90 to materially inhibit the gas flow, e.g., enough so that the vacuum pump 26 (FIG. 1) will not be able to maintain a desired pressure in the primary reaction chamber 12 (FIG. 1), or it will require an unacceptably, e.g., uneconomically, long time to pump the primary reaction chamber 12 down to a desired pressure. Therefore, the primary insert 90 in the example device 10 is easily removable and replaceable with a new or cleaned primary insert 90, as will be explained in more detail below.

To provide more capacity for accumulating solid build-up in the primary insert 90, the primary insert 90 is structured in a tapered configuration, extending from a smaller radius at the front (upstream) portion 100 to a larger radius at the rear (downstream) portion 104. With this tapered configuration, larger solid build-up 98 at the front portion 100 does not occlude or inhibit flow of the gaseous mixture between the build-up 98 and the housing side wall 88 to the more rearward (downstream) portions before the rearward portions of the primary insert mesh 90 have an opportunity to accumulate and substantially fill with solid material. Ideally, the taper would and could be conical for maximum utilization of available volume for accumulation. However, the taper can be provided sufficiently by a tiered insert structure as illustrated by the tiered primary insert 90 shown in FIGS. 2 and 4, which may be somewhat easier and more economical to manufacture than a conical configuration. In the tiered primary insert 90 configuration shown in FIGS. 2 and 4, the primary insert 90 comprises a back or base cylindrical tier 104 mounted on a flange 106, which is mounted on a rim 108 of the housing 88 and held in place by the rear end plate 110. A middle cylindrical tier 102 extends axially forward from the back or base tier 104, and a front cylindrical tier 100 extends axially forward from the middle tier 102. Each successive tier from the base tier 104 to the middle tier 102 to the front tier 100 has a smaller diameter than the preceding tier to provide the tapered shape of the insert that leaves more space between the front tier 100 and the housing side wall 88 than between the middle tier 102 and the side wall 88, which in turn leaves more space between the middle tier 102 and the side wall 88 than between the base tier 104 and the side wall 88. An insert end cap 112 occludes the axially forward (upstream) end of the front tier 100 so that the gaseous mixture of silane and treatment reactive gas has to flow through one or more of the tiers 100, 102, 104 in order to reach the outlet 34. While the primary insert 90 shown in FIGS. 2 and 4 has three cylindrical tiers 100, 102, 104, any number of tiers could be used, and the tiers can be any shape, not just cylindrical. Moreover, as mentioned above, the primary insert 90 could be conical, or it could be shaped like a pyramid, or any other tapered configuration.

Although the primary insert 90 can be structured in a variety of ways, the example primary insert 90 implementation shown in FIG. 4 has each tier made of mesh 140, 142, 144, respectively, formed around a perforated sheet metal cylinder 101, 103, 105, respectively. The sheet metal cylinders 101, 103, 105 support and maintain the cylindrical configuration of the respective mesh tiers 100, 102, 104, and the holes 114, 116, 118 perforated through the sheet metal cylinders 101, 103, 105 allow the gas to flow through the cylinders 101, 103, 104.

As mentioned above, when the primary insert 90 gets clogged with solids, the primary insert 90 can be removed for disposal or cleaning and can be replaced with a new or clean primary insert 90. To remove the primary insert 90, the back end plate 110 of the device housing 40 can be removed, which unclamps the flange 106 and allows the primary insert 90 to be pulled out of the primary containment chamber 48. The end plate 110 can be attached to the housing 88 in any convenient manner known to persons skilled in the art, for example, with clamps 114 as shown in FIG. 2.

About eighty to ninety percent or more of the silane in the gaseous mixture can be reacted and removed from the gas flow in the primary containment chamber 48 with reactions before and in the primary insert 90 as described above, so about ten to twenty percent, perhaps less, of the process silane may remain in the gas flow 92, 94, 96 emerging from the primary insert 90. Therefore, a secondary insert 122 is positioned in a secondary containment zone 50 inside the primary insert 90 between the primary inset 90 and the outlet 34 for creating another turbulence in the gas flow 124 in order to induce further reaction to consume the remaining silane in the gas flow. The secondary insert 122 can comprise any structure or element 125 that creates sufficient turbulence and dwell time for the gas flow to react the remaining process silane with the treatment reactive gas, but not to impede gas flow conductance enough to interfere with pumping or maintaining the needed vacuum in the process reaction chamber 12 (FIG. 1). For example, the element 125 can be constructed similar to the primary insert 90, which, in this example, is an elongated cylindrical mesh 126 wrapped around and supported by a perforated sheet metal cylinder 128. The mesh 126 and perforated cylinder 128, which can be perforated sheet metal, screen, or other material, are mounted to the back end plate 110 by an elongated rod 130 and a front end plate 132. The front end plate 132 also occludes the front end of the cylindrical mesh 126 and cylinder 128 so that the gas flow 124 has to flow through the mesh 126. The mesh 126 in the secondary insert 122 can also be removed for cleaning or replacement by removing the back end plate 110 from the housing 88 and unfastening the nut 134 from the rod 130. The mesh cylindrical structures of the primary insert 90 and of the secondary insert 122 can be similar to the mesh medium or any of the other media in U.S. Pat. No. 6,197,119, which is incorporated herein by reference.

After all of the remaining process silane in the gas flow is reacted and removed from the gas flow as described above, the remaining inert or other gaseous byproducts in the flow continue to the exit zone 52, where the outlet 34 can be connected to the downstream exhaust pipe 16 (FIG. 1). One or more cleanout ports 136, 138 (FIG. 3) can be provided in the primary containment zone housing sidewall 88 for removing solid products of the reaction in the primary containment zone 48. For example, a vacuum hose may be inserted through either of the cleanout ports 136, 138 to suck out solids 84 on the bottom of the primary containment zone 48 (FIG. 4) or to suck out some of the solids contained in the mesh of the primary insert 90. Such interim cleaning could prolong the time that the device 10 can remain in service before it needs to be taken offline and opened to remove and replace or clean the primary insert 90 and possible the secondary insert 122, as described above.

Another example embodiment 150 of the reactive chemical containment system is shown in FIGS. 7-10. The structures and functions of the entry zone 42, diffusion zone 44 and mixing zone 46 of this example embodiment 150 are the same as described above for the embodiment 10, including the diffusion plate 70. The rest of the structure is distributed longitudinally in a more stretched-out configuration. The mixing zone 46 transitions from the diameter of the mixing chamber 60 housing 62 to the larger diameter housing 152 that encloses the primary containment zone 48 with a flared swage section 154. As the process silane 56 and the treatment reactive gas 68 (see FIG. 10) mix in the flared mixing zone 46, as indicated by flow arrows 156, the flow velocity slows to avoid turbulence and minimize reaction in the mixing zone 46.

Figure 7:
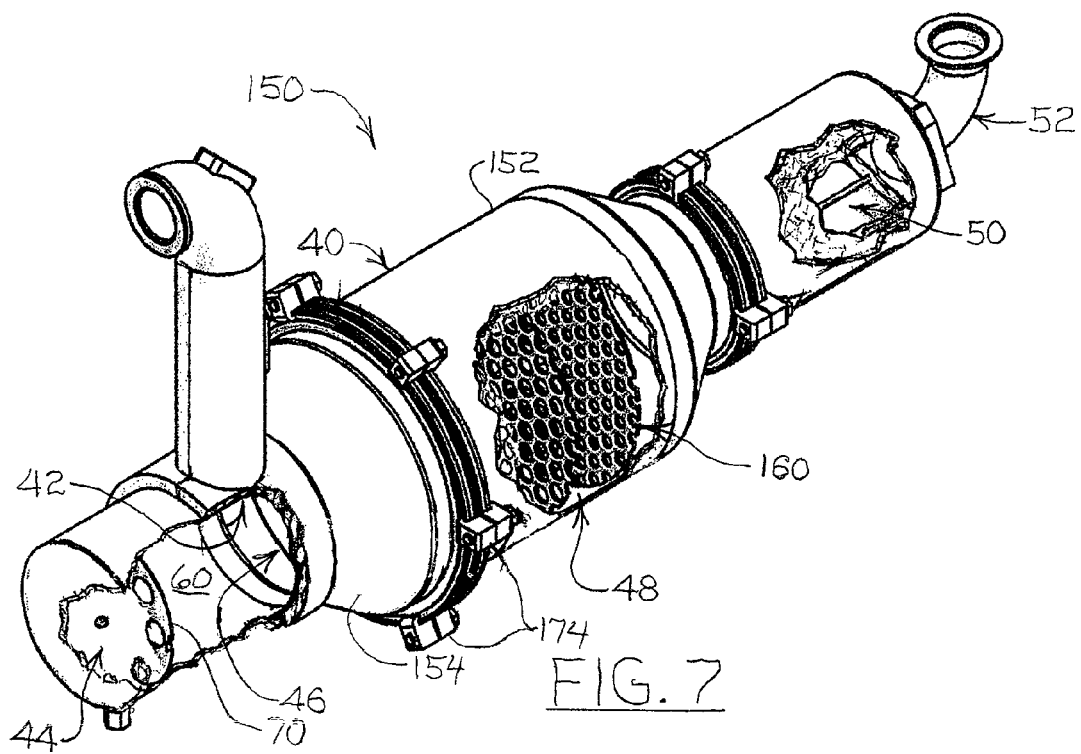
FIG. 7 is an isometric view of another example reactive chemical containment apparatus embodiment with several portions of the exterior structure and of internal containment elements shown cut away to reveal some of the interior components.

In the primary containment zone 48, the flow encounters and traverses a primary insert 160, which creates turbulence to decrease mean-free path between the silane and treatment reactive gas molecules and extends dwell time of the gas flow to induce reaction, as explained above in relation to the primary insert 90 of the first embodiment device 10. The example primary insert 160, shown in more detail in FIGS. 11 and 12, comprises a series of perforated plates 161, 162, 163 mounted in spaced-apart relation to each other on a longitudinal rod 164. The rod 164 extends longitudinally from a hub 165 at the intersection of several spokes 166, which extend radially inward from a mounting ring 168 to the hub 165. The primary insert 160 is mounted in the primary containment zone 48, for example, by sandwiching the mounting ring 168 between flange 170 of the housing 152 and flange 172 of the flared section 154. In this example mounting, those flanges 170, 172 are clamped together with clamps 174 as shown in FIGS. 7 and 10.

The flow of the gaseous mixture successively through the perforated plates 161, 162, 163 creates turbulence and thorough mixing to enhance reaction of the process silane with the treatment reaction gas to consume the process silane and produce solid-reaction product, thereby effectively removing the reacted process silane from the gas flow. The solid reaction product can fall to the bottom of the primary containment chamber 48, as shown at 180. One or more optional cleanout ports 182 can be provided in the housing 152, as shown in FIGS. 8 and 9, for interim cleaning, for example by inserting a vacuum hose (not shown) through the ports 182 to suck out solid granules or powder 180 from the primary containment chamber 48.

Figure 11:
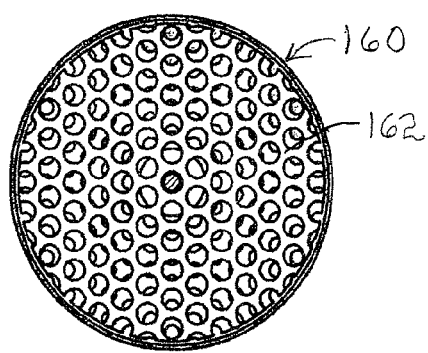
FIG. 11 is a cross-sectional view of the reactive chemical containment apparatus taken along section line 11-11 in FIG. 9.
Figure 12:
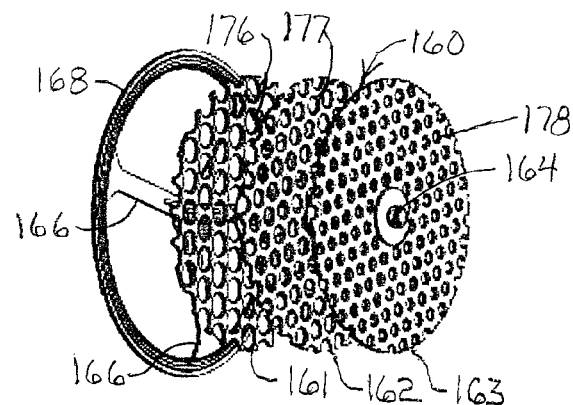
FIG. 12 is an isometric view of an example primary containment insert assembly for the reactive chemical containment system.
Figure 13:
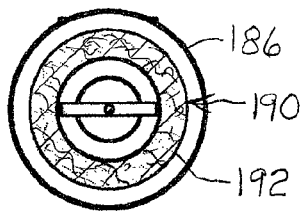
FIG. 13 is a cross-sectional view of the reactive chemical containment apparatus taken along section line 13-13 in FIG. 9.

As best seen in FIGS. 11 and 12, the perforated plates 161, 162, 163 can, but do not necessarily have to, have different sized holes, e.g., larger holes 176 in the front (upstream) plate 161, mid-sized holes 177 in the middle plate 162 that are smaller than the holes 176, and smaller holes 178 in the back (downstream) plate 163 that are smaller than the holes 177 in the middle plate 162. The larger holes in the front plate 161 accommodate more solid build-up in the front plate 161 before the build-up inhibits flow, while the smaller holes in successively downstream plates 162, 163 create more turbulence and closer instantaneous mean-free path between molecules to induce further reaction as the process silane and the treatment reactive gas become more depleted. Of course, more or fewer perforated plates can also be used.

Downstream of the primary insert 160, a decreasing diameter swage section 184 connects the housing 152 of the primary containment chamber 48 to the smaller diameter housing 186 that encloses the secondary containment chamber 50. A secondary insert 190 comprising an element 191 for creating a turbulence and enough dwell time for the gas flow to react the remaining process silane is positioned in the secondary containment chamber 50. One example element 191 can include a mesh cylinder 192, which can, but does not have to, be much the same as the secondary insert in the first embodiment 10 of the device as described above. The gas flows from the primary containment chamber 48, through the swage section 184 as indicated by arrows 194, to the secondary containment chamber 50, where it flows through the mesh cylinder 192 of the secondary insert 190, as indicated by the flow arrows 196. The turbulence and reduced mean-free path between silane molecules and treatment reactive gas molecules in the flow 196 induces reaction of the remaining silane in the flow. Therefore, the gas flow out the outlet 198 in the exit zone 52, as indicated by arrow 199, has substantially no process silane.

While the example reactive chemical containment device 10 described above is illustrated and described in operation with its longitudinal axis 66 oriented vertically and the example reactive chemical containment device 150 is illustrated and described with its longitudinal axis 158 oriented horizontally, any of these devices can be operated either vertically or horizontally or any angle between vertical and horizontal. In practice, the particular orientation used may be selected to accommodate available space in the vicinity of the primary deposition chamber 12 (FIG. 1) in a particular installation or situation.

As explained above, the example primary inserts 90, 160 of the example reactive chemical containment devices 10, 150 create turbulence and extend resident time of the process gas and treatment reactive gas mixtures in the primary containment chamber 48 to enhance or force reaction of the process gas with the treatment reactive gas in the primary containment chamber 48 and to contain as much of the solid reaction byproduct as possible in the primary containment chamber 48. The tiered mesh primary insert 90 and perforated plate primary insert 160 described above are not the only structures or configurations that can provide those functions. Several additional example primary insert structures and configurations are shown in FIG. 14-23.

Figure 15:
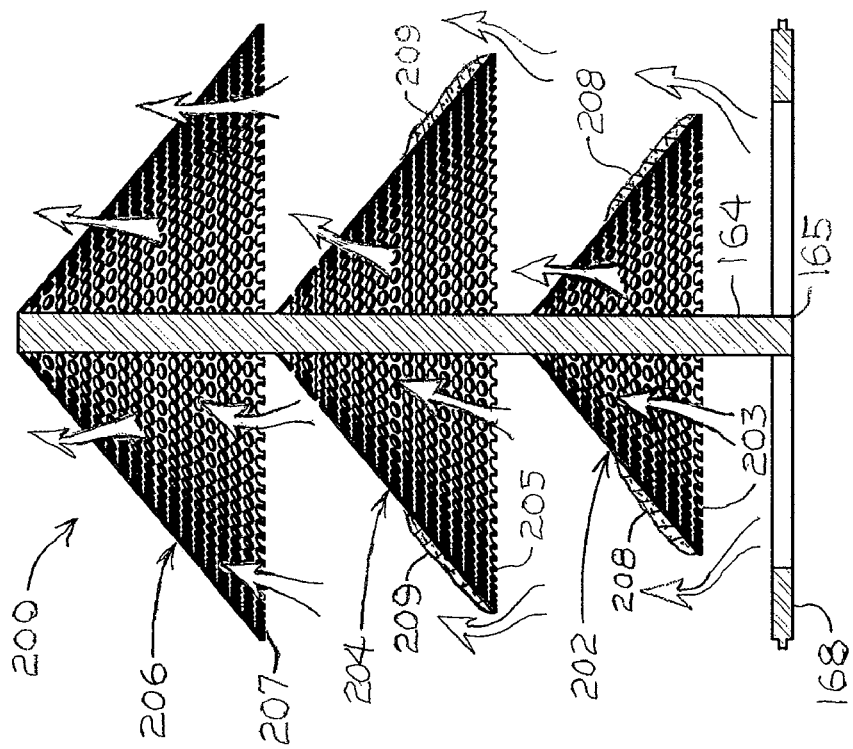
FIG. 15 is a cross-sectional view of the example primary insert in FIG. 14.
Figure 14:
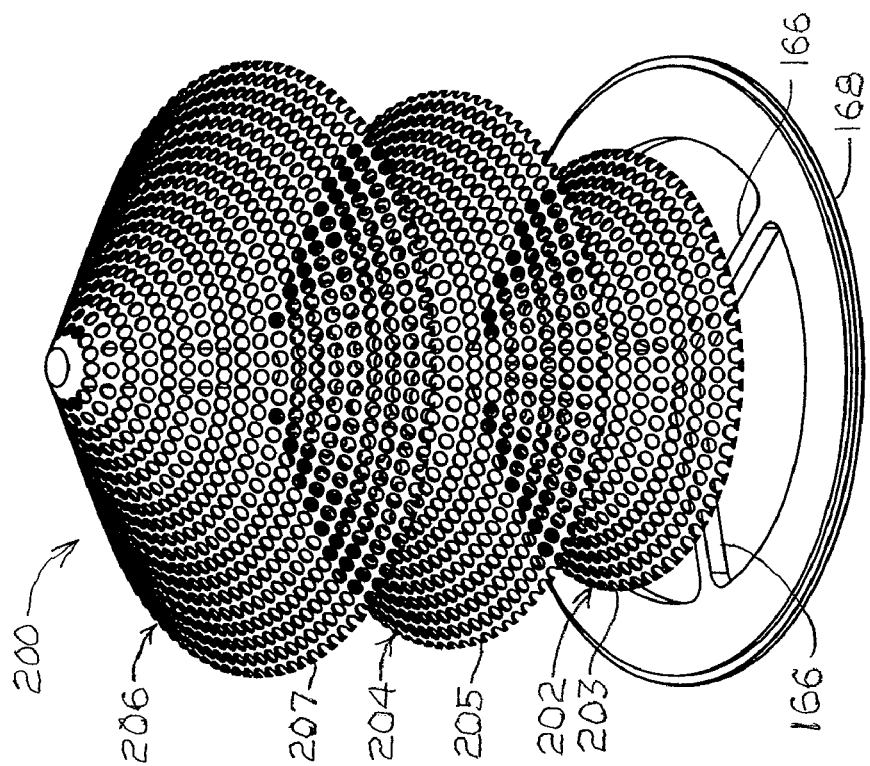
FIG. 14 is an isometric view of an example alternative primary insert comprising a tapered succession of perforated conical plates.

The example primary insert 200 in FIGS. 14 and 15, which can be substituted for the example primary insert 90 in the reactive chemical containment device 150, comprises a tapered succession of perforated conical plates 202, 204, 206 mounted in longitudinally spaced-apart relation to each other along the rod 164 extending longitudinally from the hub 165 of the mounting ring 168 and spokes 166. The ring 168 is mounted in the device 150, as described above.

Each successively next conical plate 204, 206 has a larger diameter bottom rim 205, 207 than the respective bottom rims 203, 205 of the preceding conical plates 202, 204. This arrangement maximizes containment capacity, especially when operated in vertical orientation as shown in FIGS. 14 and 15. Solid build-up tends to accumulate initially where the gas flow first contacts the conical plates, e.g., at the bottom portion of the first conical plate 202, as illustrated diagrammatically by the build-up 208, and then at the bottom portion of the second conical plate 204, as illustrated diagrammatically by the build-up 209. When the reaction byproduct comprises fine particulate matter or powder, such as the silicon dioxide described above, the build-up 208 on the conical plate 202 and the build-up 209 on the conical plate 204 may comprise particulate matter or powder that falls by gravity from the reactions occurring in or adjacent the conical plates 204, 206 immediately above the respective plates 202, 204. As the build-up 208, 209 accumulates on the lower portions of the conical plates 202, 204, the gas flow diverts naturally around such build-up 208, 209, as indicated by the flow arrows in FIG. 15, both inwardly toward the centers of the conical plates 202, 204 and outwardly around the peripheries of the conical plates 202, 204. Since the gas flow can go around the outside edges or peripheries of the first and middle conical plates 202, 204, the build-up of particulate matter or powder 208, 209 on those conical plates 202, 204 will not block the gas flow and require premature cleaning or maintenance before the full containment capacity of the primary containment chamber 48 (FIG. 10) is reached. The diameter of the bottom rim 207 of the rearward conical plate 206 is large enough to meet the inside of the containment chamber housing 152 (FIG. 10), so all of the remaining gas flows through, not around, the rearward conical plate 206 and then to the secondary containment chamber 50 (FIG. 10).

Of course, there can be more or fewer than the three conical plates 202, 204, 206 shown in FIGS. 14 and 15. Also, some or all of the conical plates could be the same diameter instead of the different diameters that provide the tapered profile of the primary insert 200 configuration shown in FIGS. 14 and 15. It can also be noted in this regard that, while the perforated plates 161, 162, 163 of the primary insert 90 shown in FIGS. 10-12 are the same diameter, they can also be provided with successively larger diameters similar to the conical plates 202, 204, 206 in FIGS. 14 and 15 in order to provide the primary insert 90 with a tapered profile and some of the same benefits such a tapered profile provides, e.g., allowing gas flow around the outer edges or peripheries of the first and second perforated plates 161, 162 in order to distribute the gas flow and subsequent build-up to succeeding perforated plates 162, 163 without having the build-up on the first perforated plates 161, 162 prematurely block the gas flow through the primary containment chamber 12.

Figure 16:
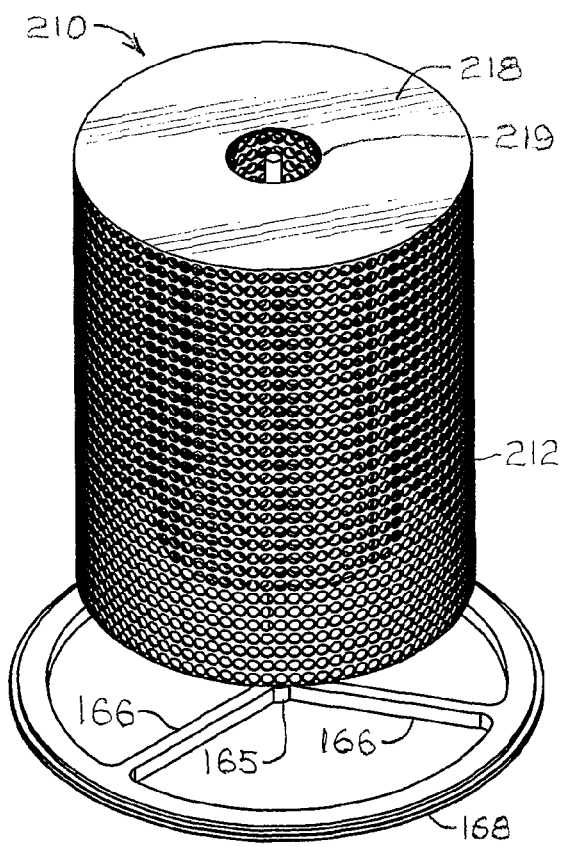
FIG. 16 is an isometric view of an example alternative primary insert comprising a plurality of concentrically arranged, perforated cylindrical sieves.
Figure 17:
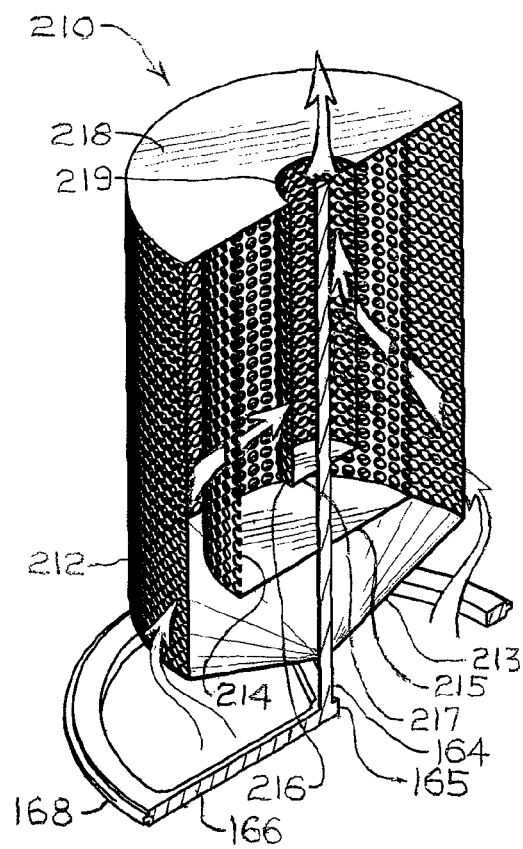
FIG. 17 is an isometric, cross-sectional view of the example primary insert in FIG. 16.

The example primary insert 210 shown in FIGS. 16 and 17 comprises three perforated cylindrical sieves 212, 214, 216 mounted concentrically on the rod 164. The rod 164 is mounted on and extends longitudinally from the hub 165 of the ring 168 and spokes 166, as described above, and the ring 168 mounts in the device 150, as also described above.

The bottom or leading ends of the perforated cylindrical sieves 212, 214, 216 are closed or blocked by front end plates 213, 215, 217, respectively, so that the gas flow has to flow around to the outside of the outer cylindrical sieve 212 and then successively through the perforations in the cylindrical sieves 212, 214, 216, as indicated by the flow arrows in FIG. 17. The top or back ends of all of the perforated cylindrical sieves 212, 214, except the innermost cylindrical sieve 216, are closed or blocked by a back end plate 218 so that the gas has to flow through all of the perforated cylindrical sieves 212, 214, 216 before emerging from the back end 219 of the innermost perforated cylindrical sieve 216, as indicated by the flow arrows in FIG. 17. Of course, there can be more or fewer than the three perforated cylindrical sieves 212, 214, 216.

One advantage of the perforated cylindrical sieve example primary insert 210 is that, when used in a vertical orientation as shown in FIGS. 16 and 17, most of the particulate or powder reaction byproducts, for example, the silicon dioxide reaction by product discussed above, will fall by gravity onto the front or bottom end plates 213, 215, 217 and be retained there, so that it cannot fall onto the diffusion plate 70 (see FIG. 10), where it could interfere with the in-flow and diffusion of the treatment reactive gas. The top or back end plate 218 can be removable to accommodate removal and cleaning of such particulate or powder byproducts from the perforated cylindrical sieves during planned maintenance servicing.

The example primary insert 220 shown in FIGS. 18 and 19 comprises a labyrinth of cylindrical barrels 222, 224, 226, 228 mounted concentrically, one inside another, on the rod 164. The front or bottom ends 232, 236 of the outside barrel 222 and the mid-inner barrel 226, respectively, are closed or blocked by front or bottom end plates 242, 246, respectively, while their back or top ends 252, 256 are left open. The back or top ends 254, 258 of mid-outer barrel 224 and the innermost barrel 228 extend rearwardly or upwardly a distance beyond the open back or top ends 252, 256 of the outer barrel 222 and the mid-inner barrel 226. The front or bottom ends 232, 236 of the outer barrel 222 and the mid-inner barrel 226 extend forwardly or downwardly beyond the open front or bottom ends 234, 238 of the mid-outer barrel 224 and innermost barrel 228, respectively. A back or top plate 244 extends over and closes the back or top end 254 of the mid-outer barrel 224 to the back or top end 258 of the innermost barrel 228. An aperture 248 in the center portion of the top plate 244 leaves the back or top end 258 of the innermost barrel 228 open. The result of this structure and configuration is a labyrinth of concentric, cylindrical flow paths in and between the barrels 222, 224, 226, 228 through which the gas flows as indicated by the flow arrows in FIG. 19 from the front or bottom of the primary insert 220 to emerge from the back or top aperture 248.

The labyrinth causes turbulence in the gas flow, especially where the flow changes direction at the tops 252, 256 and bottoms 234, 238 of the barrels 222, 226 and 224, 228, respectively, as indicated by the flow arrows in FIG. 19, which enhances reaction of the process gas and the treatment reactive gas. Where the reaction byproduct is particulate or powder, such as the silicon dioxide reaction byproduct discussed above, most of such reactive byproduct is contained in the barrels 222, 224, 226, 228. The top plate 244 and barrels 224, 228 can be removed from the other barrels 222, 226 for removing and cleaning the particulate or powder byproduct during planned maintenance servicing.

The example alternative primary insert 260 shown in FIGS. 20 and 21 includes a honeycomb core 161, which can be formed by a plurality of honeycomb elements 262 stacked in a barrel 264. The barrel 264 is mounted on and extends longitudinally from a ring 168 that mounts in the reactive chemical containment device 150, as described above. Therefore, all of the gas flows through the honeycomb core 261, which spreads the gas flow fairly uniformly over the cross-sectional area of the honeycomb core 261 and creates the turbulence that enhances or forces the reaction of the process gas and the treatment reactive gas. While not essential, the creation and enhancement of the turbulence in the gas flow can be improved even more by placing the honeycomb elements 262 in the stack in a manner that offsets the honeycomb cells 266 in adjacent honeycomb elements, as illustrated in FIG. 21. The honeycomb elements 262 can be removed from the barrel 264 and separated from each other for cleaning individually, if desired, or they can be replaced.

The example alternative primary insert 270 shown in FIGS. 22 and 23 includes a brush-like element 272 with a plurality of bristles 274 extending radially outward in all directions from the rod 164. The mounting of the rod 164 in the hub 165 so that the brush-like element 272 is supported by the ring 168 and spokes 166 in the example reactive chemical containment device 150 as described above. The bristles 274 distribute the gas flow across the cross-sectional area of the brush-like element 274 and create the turbulence in the gas flow for enhancing the reaction of the process gas with the treatment reactive gas to consume the process gas as explained above. The bristles 274 also retain at least some of the reaction byproduct, and the brush-like element 272 can be removed for cleaning or replacement.

Figure 25:
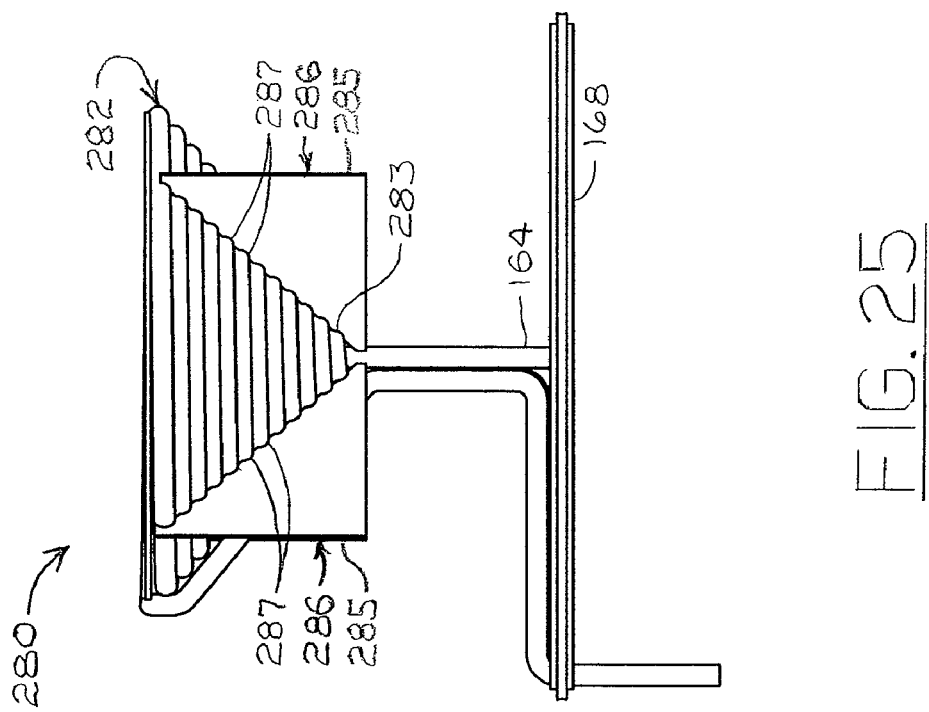
FIG. 25 is a side elevation view of the example primary insert in FIG. 24.
Figure 24:
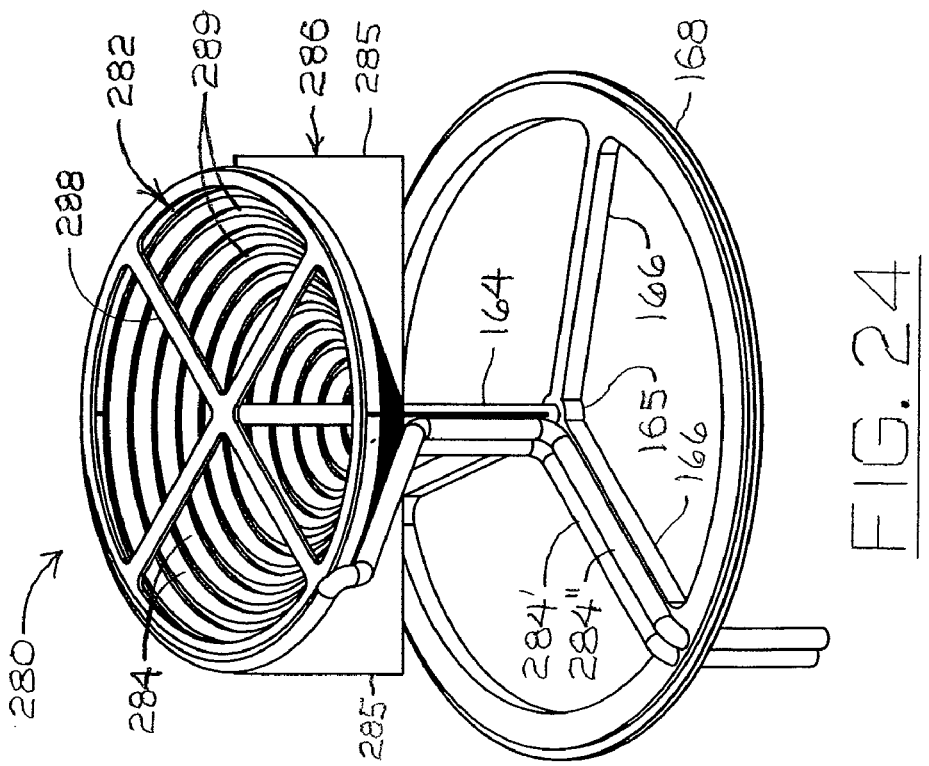
FIG. 24 is an isometric view of an example alternative primary insert comprising a tapered coil of cooling tube.

The example alternative primary insert 280 shown in FIGS. 24 and 25 comprises a conically configured, tapered coil 282 of cooling tube 284 mounted on the rod 164 of the ring 168, spoke 166, and hub 165 mounting assembly described above. This tapered cooling tube coil 282 is useful primarily for process gases that have a condensable constituent that can be removed from the gas flow by condensation, or it can be used to increase the gas temperature to enhance the rate of chemical reaction if desired. Either a cool fluid or a hot fluid can be flowed through the tube 284. The tapered coil 282 can be used alone, depending on the character of the process gas and flow parameters, but it may be particularly useful when combined with, for example, one or more of the perforated plates (e.g., plates 162, 163) of the perforated plate primary insert 90, as shown, for example, by the alternative primary insert 290 in FIGS. 26 and 27, to treat process gases that comprise a condensable constituent that will condense upon being cooled by the coil 282, while, at the same time, being able to convert the other reactive process gas constituent into stable byproducts inside the device 150. For example, process and exhaust gases from a PECVD nitride process can comprise condensable $(NH_4)_2SiF_6$ as well as unreacted process silane. In that kind of application, it is usually preferable to position the cooling tube coil 282 as a first stage to remove the condensable byproducts. One example of implementing the cooling coil 282 in this manner is to replace the first perforated disk 161 with this cooling coil 282 as shown in FIGS. 26 and 27.

Referring again primarily to FIGS. 24 and 25, the tube 284 is coiled in a tapered coil 282 and nested on shaped or notched edges 287 of one or more centering plates 286 that are configured and spaced so that there are gaps 289 between adjacent loops of the tube 284 in the coil 282. Therefore the mixture of process gas and treatment reactive gas can flow through the gaps 289 between the adjacent loops of tube 284. Such gas flow through the gaps 289 creates turbulence while also heating or cooling the gas to enhance or force reaction, condensation, or dissociation of process gas. While not essential, there are benefits in nesting the loops of tube 284 in a tapered profile, such as the conical tube coil 282 shown in FIGS. 24 and 25, because build-up of reaction byproducts or condensation will occur first at the leading point 283 of the conically tapered coil 282. When the gaps near the point 283 become blocked with build-up, the gas flow will self-distribute farther outwardly to wider diameter sections of the tapered coil 282. The outer edges 285 are made to roughly match the inside diameter of the housing 152 so that they function to center and support the coil 282 laterally in the housing 152.

A top retainer 288 attached to the distal end of the rod 164 can be provided to help keep the coiled loops of tube 284 nested properly in the plates 286. The ends 284', 284" of the tubes can extend along a spoke 166 to the ring 168, where they can be extended through the housing 152 (FIG. 10) to a source of cooling or heating fluid, which is not shown, but is well within the capabilities of persons skilled in the art.

Figure 27:
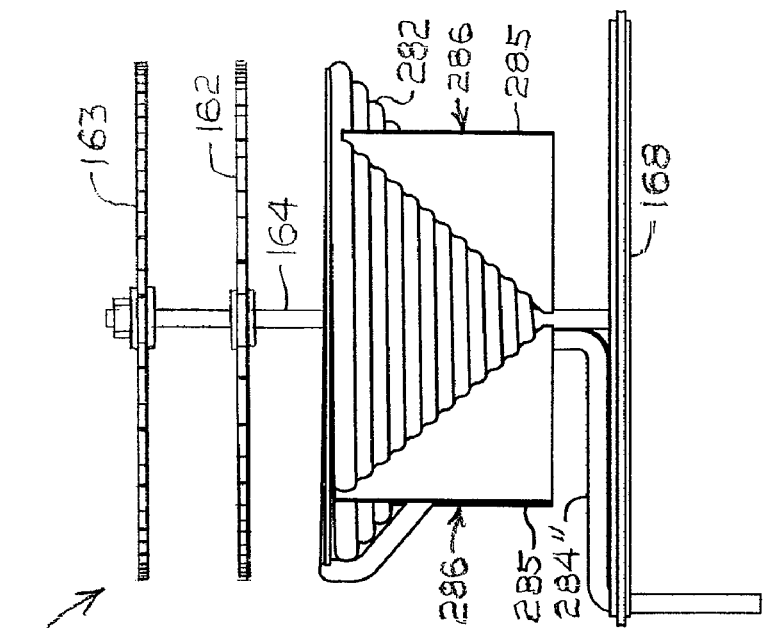
FIG. 27 is a side elevation view of the example primary insert of FIG. 26.
Figure 26:
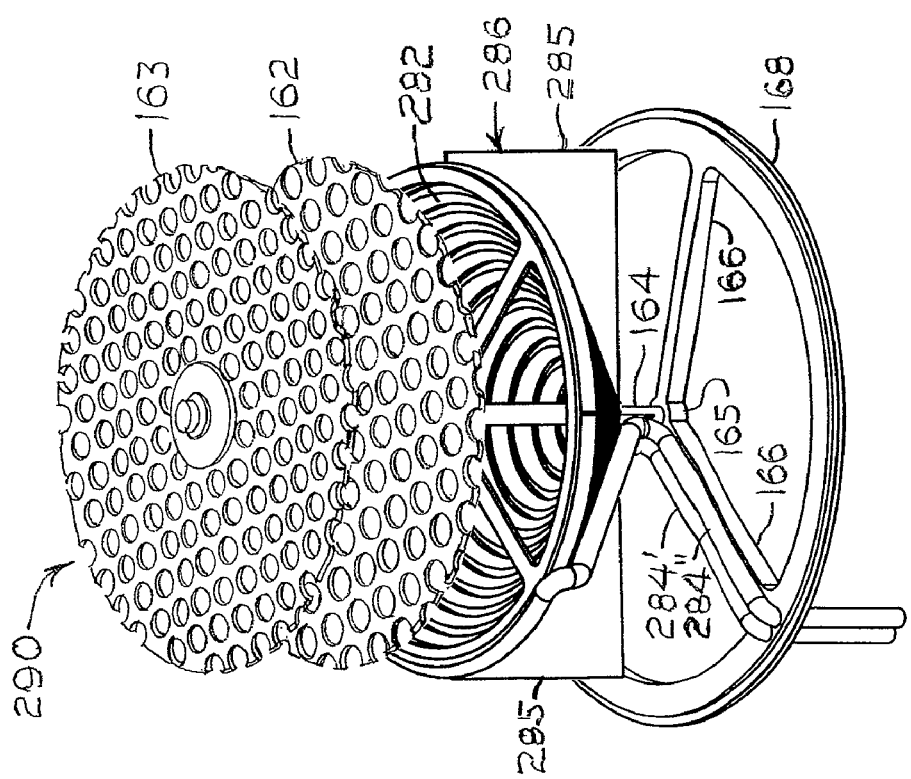
FIG. 26 is an isometric view of an example alternative primary insert comprising a combination of a cooling tube and perforated plates.

As mentioned above, the example alternative primary insert 290 in FIGS. 26 and 27 combines the tapered coil 282 of the alternative primary insert 280 in FIGS. 24 and 25 with one or more of the perforated plates, e.g., plates 162, 163, of the example alternative primary insert 160 in FIGS. 10-12. Of course, the coil 282 can be combined with turbulence creating surface components of any of the other primary inserts 90, 190, 200, 210, 220, 260, or 270 described above. Also, the tapered coil 282 can be tapered in the opposite direction or not tapered at all, if desired for particular configurations. For example, if the coil 282 is combined with one or more of the perforated conical plates 202, 204, 206 of the alternative primary insert 200 in FIGS. 14 and 15, it may be desirable to invert the taper of the coil 282 to match better with the taper of the perforated conical plates in order to keep the assembly as compact longitudinally as possible.

Figure 28:
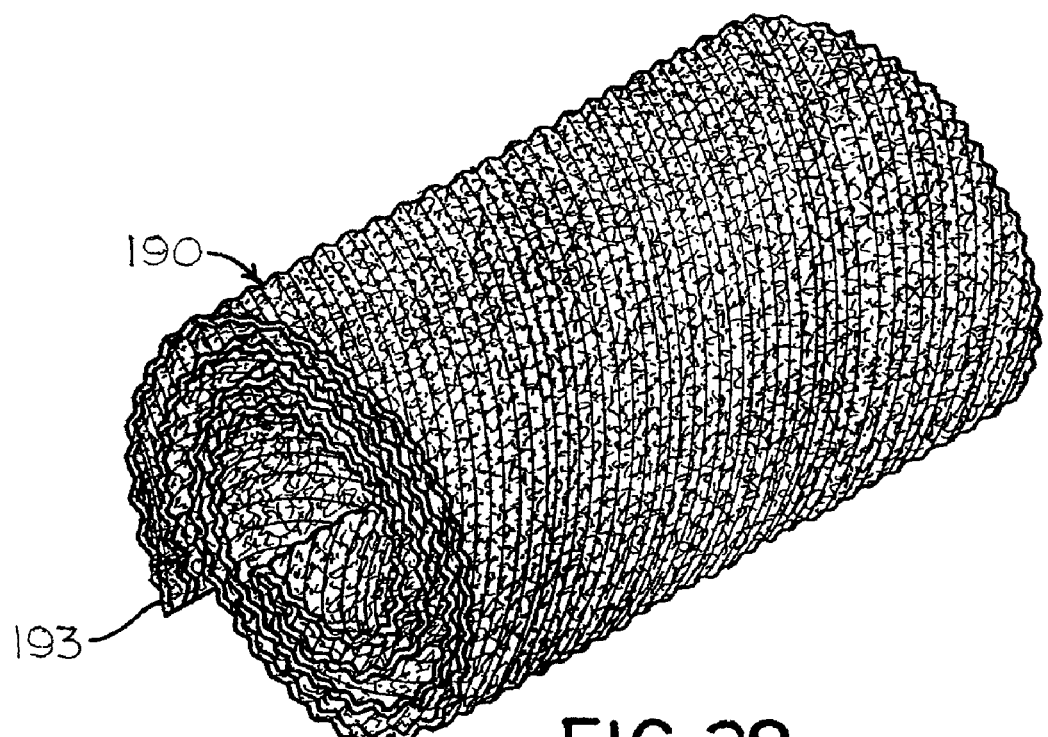
FIG. 28 is an isometric view of an example mesh secondary containment element.
Figure 29:
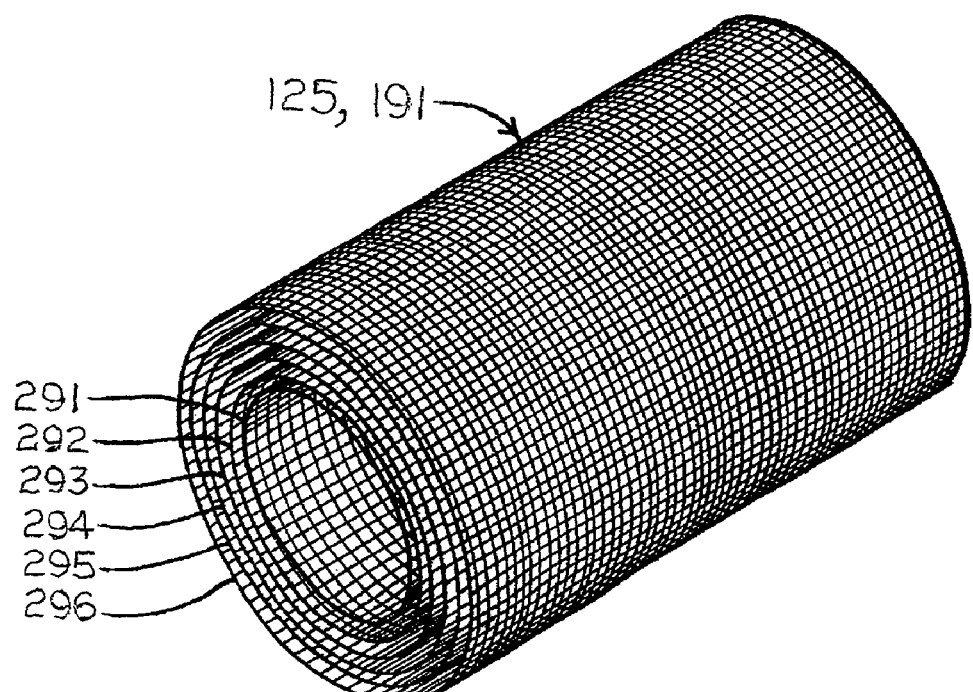
FIG. 29 is an isometric view of an example concentric screen secondary containment element.
Figure 30:
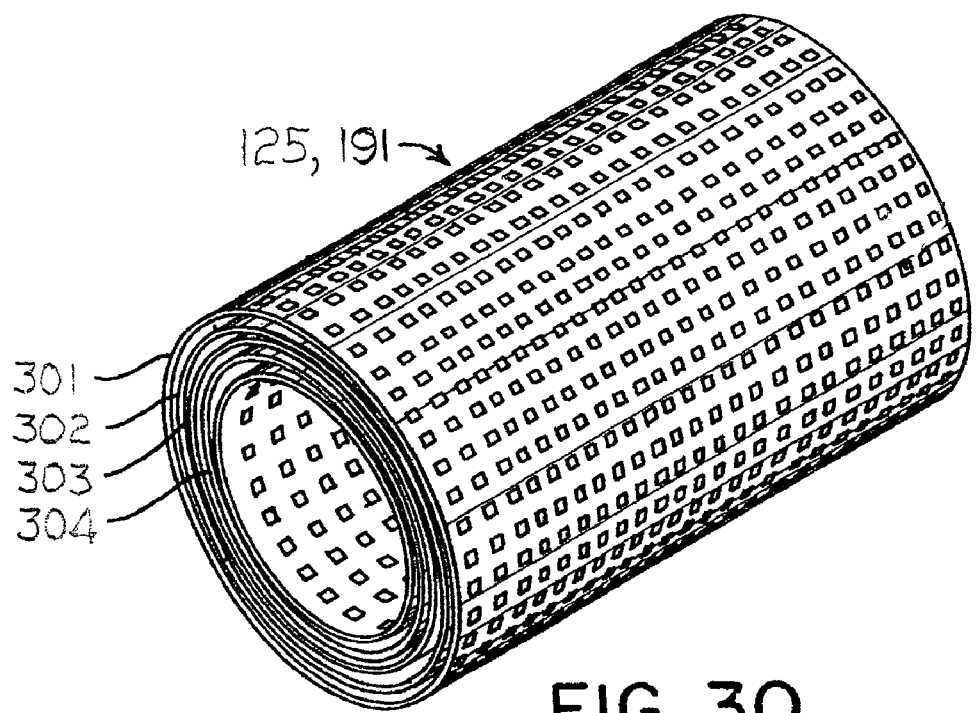
FIG. 30 is an isometric view of an example concentric perforated cylinder secondary containment element.
Figure 31:
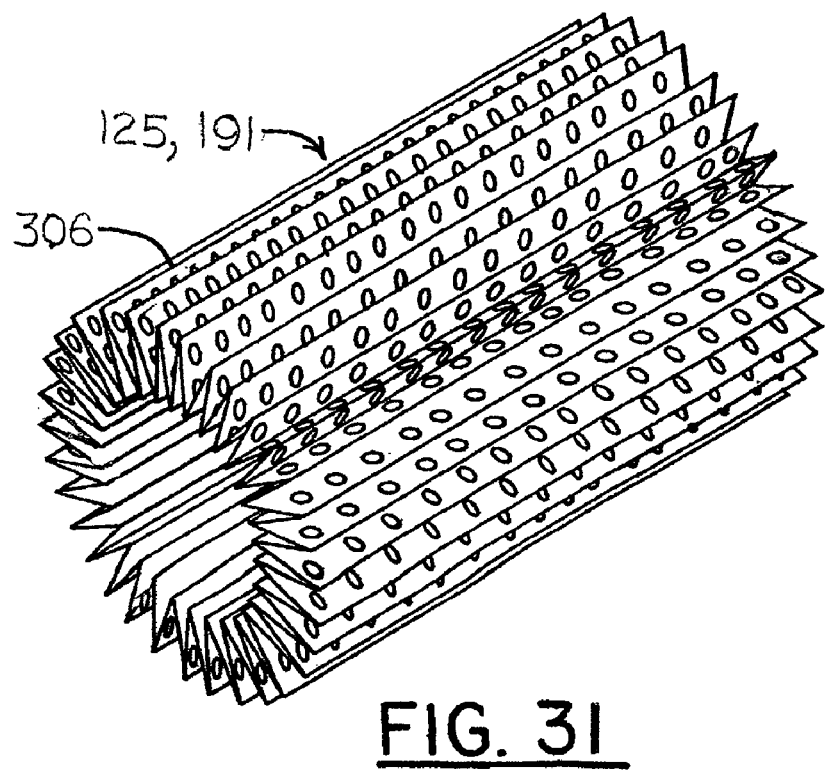
FIG. 31 is an isometric view of an example pleated and perforated sheet secondary containment element.
Figure 32:
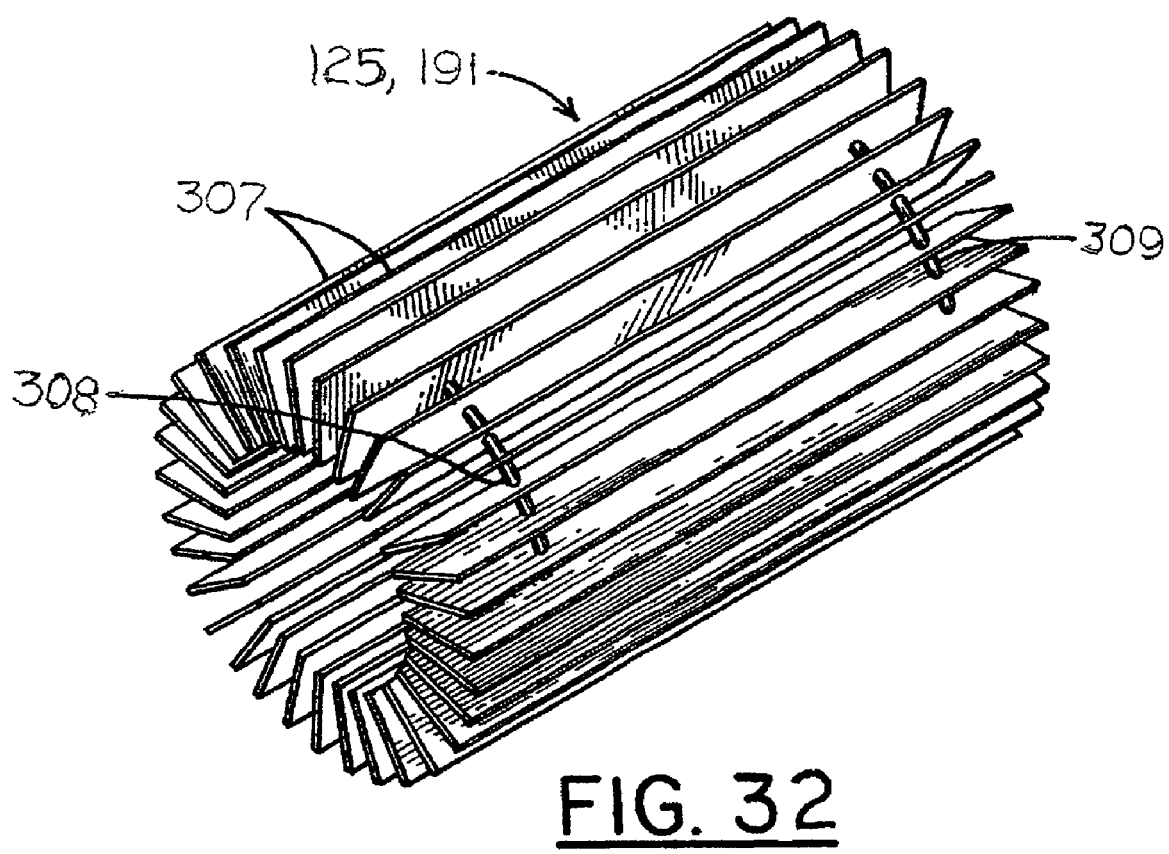
FIG. 32 is an isometric view of an example radiating plate secondary containment element.

As mentioned above, the element 125 of the secondary insert 122 in the example reactive chemical containment device 10 and the element 191 in the secondary insert 190 in the example chemical containment device 150 can be comprised of a mesh material formed in a cylindrical shape. An example of such mesh comprising a crimped wire fabric 193 rolled into the cylindrical mesh roll 190 is illustrated in FIG. 28. However, the elements 125, 191 can have different structures that provide the turbulence, surfaces, gas flow distribution, and resident time required to react the remaining process gas. For example, but not for limitation, the elements 125, 191 can be provided by: (i) a plurality of concentric cylindrical screens 291, 292, 293, 294, 295, 296, as illustrated in FIG. 29; (ii) a plurality of concentric perforated cylindrical foils 301, 302, 303, 304, as illustrated in FIG. 30; (iii) a perforated foil sheet 306 folded in a hand-fan manner (pleats) and pulled into a cylinder, as illustrated in FIG. 31; or (iv) a plurality of elongated foil leaves 307 positioned and held in a cylindrical shape by wires 308, 309, as illustrated in FIG. 32.

As mentioned above, the diffusion of the treatment reactive gas into the pre-mixing chamber can be implemented in myriad ways. Several example alternative diffuser arrangements are shown in FIGS. 33-38, although other alternatives not shown could also be used.

Figure 33:
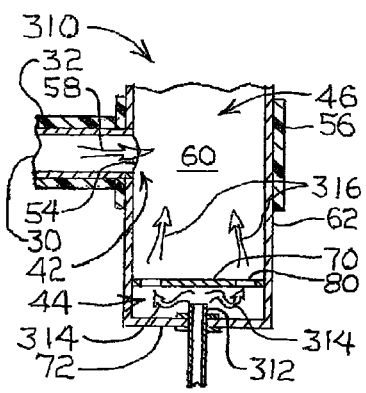
FIG. 33 is a cross-section view in elevation of an alternative diffuser arrangement.

The alternative diffuser arrangement 310 shown in FIG. 33 is similar to the diffuser in FIGS. 2, 4, and 10, including the baffle or diffuser plate 70 positioned in the pre-mixing chamber 60 between a treatment reactive gas inlet nozzle 312 and the process gas inlet opening 54. However, the inlet nozzle 312 in the diffuser arrangement 310 in FIG. 33 is directed into the diffuser zone 44 through the front end wall 72 of the pre-mixing chamber housing 62, instead of through the diffuser plate 70, as shown and described in the FIGS. 2, 4, and 10 arrangement. Therefore, the treatment reactive gas is injected through the inlet nozzle 312 into the diffusion zone 44 from where it flows as indicated by flow arrows 314 in FIG. 33 through the apertures 80 and to the pre-mixing zone 46, as indicated by flow arrows 316. The treatment reactive gas flow 316 begins mixing with the inflow 58 of process gas in the pre-mixing zone 46 and quickly moves to the primary containment zone 48 (FIGS. 2, 4, and 10) as explained above. While the inlet nozzle 312 in this diffuser arrangement 310 in FIG. 33 may be slightly more susceptible to blockage by solid byproduct falling through the apertures 80 than the inlet nozzle 76 in FIGS. 2, 4, and 10, other considerations, for example, installation considerations or space constraints may make it advantageous.

Figure 34:
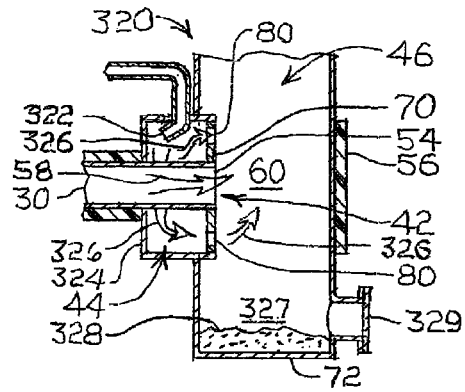
FIG. 34 is a cross-section view in elevation of another alternative diffuser arrangement.

In another alternative diffuser configuration 320 shown in FIG. 34, the diffusion zone 44 and baffle or diffuser plate 70 are positioned concentrically around the process gas inlet opening 54 and exhaust pipe 30. The treatment reactive gas is injected by an inlet nozzle 322 into the diffusion zone 44 enclosed by a cylindrical diffusion chamber housing 324 around the exhaust pipe 30, where it diffuses throughout the diffusion zone 44 and emerges uniformly through the apertures 80 in the diffusion plate 70, as indicated by the diffusion flow arrows 326. The flow of process gas 58 into the pre-mixing chamber 60 begins to mix with the treatment reactive gas flow 326 in the pre-mixing zone 46 and rapidly moves to the primary containment zone 48 (not shown in FIG. 34), as explained above. The closer proximity of the diffusion zone 44 to the inlet zone 42 in this diffuser arrangement 320 as compared to the diffuser arrangement shown in FIGS. 2, 4, 10, and 33 and described above make the diffuser zone 44 in this arrangement 320 somewhat more susceptible to backflow of process gas into the diffusion zone and reacting there to produce solid byproduct in the diffusion zone 44 than such other diffuser arrangements. However, it has the advantage of a bin space 327 in the bottom portion of the pre-mixing chamber 60, where solid byproduct 328 can accumulate without interfering with the inlet nozzle 322 or other functions. An openable and closable cleanout port 329 can be used to vacuum out the solid byproduct accumulation 327 between programmed maintenance disassembly of the reactive chemical containment devices 10, 150 and thereby prolong the time periods between such programmed maintenance disassembly episodes.

Figure 35:
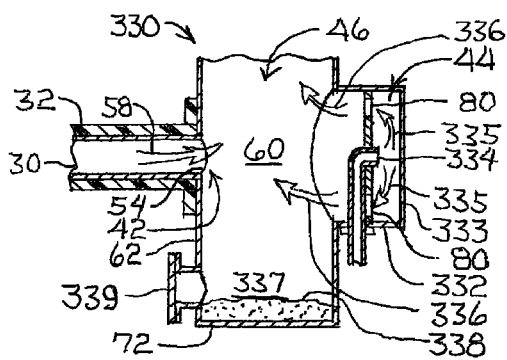
FIG. 35 is a cross-section view in elevation of another alternative diffuser arrangement.

The alternative diffuser arrangement 330 shown in FIG. 35 has the diffusion zone 44 positioned diametrically across the pre-mixing chamber 60 from the process gas inlet opening 54. A cylindrical diffusion zone housing 332 encloses the diffusion zone 44 with a side plate 333 on one end and the diffuser plate 70 positioned between the side plate 333 and the process gas inlet opening 54. A treatment reactive gas inlet nozzle 334 is positioned to extend through the diffuser plate 70 into the diffusion zone 44. The treatment reactive gas then is forced by the side plate 333 to reverse direction, as indicated by flow arrows 335, to flow through the apertures 80 in the diffuser plate 70 and then into the pre-mixing zone 46 in the pre-mixing chamber 60, as indicated by flow arrows 336. In the pre-mixing zone 46, the process gas flow 58 begins to mix with the treatment reactive gas flow 336 and rapidly moves into the primary containment zone 48 (FIGS. 2, 4, and 10). Like the arrangement 320 described above, this arrangement 330 has a bin area 337 for accumulation of solid byproduct 338 and a cleanout port 339.

Figure 36:
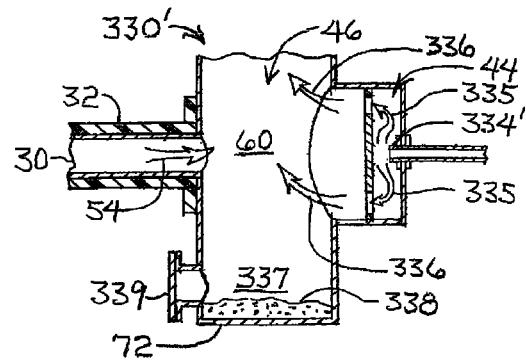
FIG. 36 is a cross-section view in elevation of another alternative diffuser arrangement.

The alternative diffuser arrangement 330' shown in FIG. 36 is similar to the diffuser arrangement 330 in FIG. 35, except that the inlet nozzle 334' for the treatment reactive gas enters the diffusion zone 44 through the side plate 333 instead of through the diffuser plate 70. Otherwise, the structure and functions of the components of the diffuser arrangement 330' in FIG. 36 are much the same as those of the diffuser arrangement 330 in FIG. 35.

Figure 37:
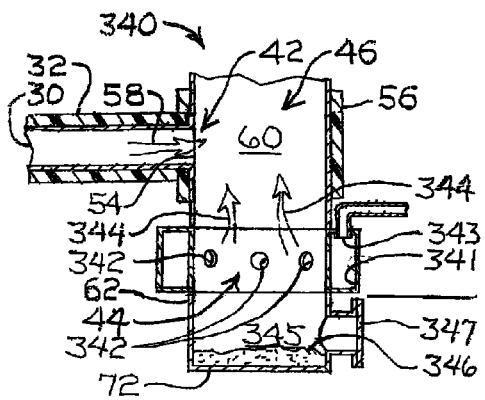
FIG. 37 is a cross-section view in elevation of another alternative diffuser arrangement.

The alternative diffuser arrangement 340 shown in FIG. 37 comprises an annular diffuser duct 341 surrounding the diffusion zone 44 in the pre-mixing chamber 60 between the end plate 72 and the process gas inlet opening 54. A plurality of diffuser apertures 342 open from the duct 341 into the diffusion zone 44. The treatment reactive gas is injected by an inlet nozzle 343 into the annular diffuser duct 341, from where it diffuses through the apertures 342 into the diffusion zone 44, as indicated by the flow arrows 344 in FIG. 37. From the diffusion zone 44, the treatment reactive gas flow 344 continues to flow through the pre-mixing chamber 60 to begin mixing with the process gas flow 58 from the process gas inlet 54. This diffuser arrangement 340 has both of the advantages of: (i) the diffusion zone 44 with the inlet nozzle 343 and diffuser duct 341 being positioned apart and upstream from the process gas inlet 54 to avoid back-streaming of process gas into the duct 341 where reaction byproduct could accumulate and clog the inlet nozzle 343 or the duct 341 itself; and (ii) also having a bin area 345 in the bottom of the pre-mixing chamber housing 62 for catching and accumulating solid byproduct 346 from the reactions above. A cleanout port 347 is also shown for cleaning the solid byproduct 346 out of the bin space 345.

Figure 38:
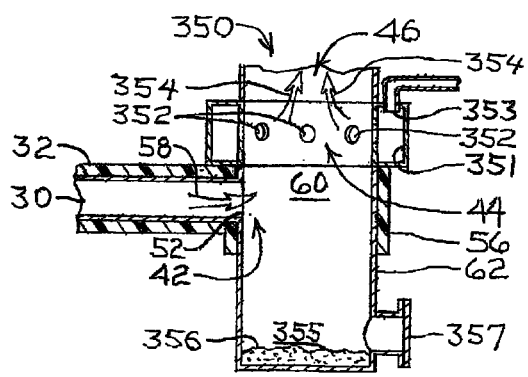
FIG. 38 is a cross-section view in elevation of another alternative diffuser arrangement.

The alternative diffuser arrangement 350 shown in FIG. 38 is similar in structure to the diffuser arrangement in 340 in FIG. 38, except that the annular diffuser duct 351 and apertures 352 are positioned above, i.e., downstream from the process gas inlet opening 54 to create the diffusion zone 44 downstream from the process gas inlet opening. Therefore, the process gas flow 58 flows through the diffusion zone 44 to start mixing with the treatment reactive gas flow 354 that flows from the diffusion apertures 352 to the pre-mixing zone 46. The treatment reactive gas is injected from the inlet nozzle 353 into the annular duct 351, from where it diffuses through apertures 352 into the pre-mixing chamber 60 to create the diffusion zone 44. Because the diffusion zone 44 is downstream from the inlet zone 42 created by the process gas inlet 54, mixing of the process gas and the treatment reactive gas starts in the treatment reactive gas diffusion zone 44 so the diffusion zone 46 and the pre-mixing zone 46 are close to each other and to some extent coincide, but the pre-mixing zone does extend downstream from the diffusion zone 44 toward the primary containment zone 48 (not shown in FIG. 38). Solid byproduct 356 can accumulate in the bin space 355 at the bottom of the pre-mixing chamber housing 62, and it can be cleaned out through the cleanout port 357.

The absolute and relative sizes of the various components can vary, depending on the process gas characteristics, magnitudes of gas flow, e.g., mass per unit of time, available space, cost, or capacity. The inlet and outlet ports 54, 34, 198 are generally sized to match or coordinate with whatever a particular exhaust line 30 may be for a particular process reaction chamber 12. The volume of the primary containment chamber 48 is generally large enough to have a capacity for containing enough reaction byproduct to meet a user's desired program maintenance intervals, if not constrained by the physical space available in a particular installation or by cost. Other component and space sizes may be adapted to the nature of the process gas composition, and physical behavior of the byproduct, as well as to maximize mixing efficiency, reaction efficiency, and to provide ample capacity in the secondary containment chamber 50 to react all remaining process gas that does not get reacted in the primary containment chamber 48.

With the foregoing in mind, the following parameters for the reactive chemical containment systems described above provide a good balance of size, efficiency, and programmed maintenance time periods for the process gases described above. The overall length L in the longitudinal direction is in the range of $12" \leq L \leq 72"$ (30 cm $\leq L \leq$ 183 cm). The diameter $D_1$ of the inlet opening 54 is in the range of $1" \leq D_1 \leq 6"$ (2.5 cm $\leq D_1 \leq$ 15 cm). The diameter $D_2$ of the diffusion zone 44 in relation to $D_1$ is in the range of $D_1 \leq D_2 \leq 6D_1$. The diameter $D_3$ of the pre-mixing zone 46 in relation to $D_1$ is in the range of $D_1 \leq D_3 \leq 6D_1$. The diameter $D_4$ of the primary containment chamber 48 is in the range of $2D_1 \leq D_4 \leq 12D_1$. The diameter of $D_5$ of the secondary containment chamber 50 in relation to $D_1$ is in the range of $2D_1 \leq D_5 \leq 6D_1$. The outlet opening 34 is usually about the same size as the inlet opening, if not larger, so the diameter $D_6$ of the outlet opening is in the range of $1" \leq D_6 \leq 6"$ (2.5 cm $\leq D_6 \leq$ 15 cm). The volume $V_4$ of the primary containment chamber 48 is often limited by available space, thus usually is as large as possible in a given situation, but is not usually necessary for the diameter $D_4$ of the primary containment chamber 48 to be either larger than 48 inches (123 cm) or smaller than two inches (5 cm). The volume $V_3$ of the pre-mixing zone 46 in relation to $V_4$ is in the range of $4V_3 \leq V_4 \leq 10V_3$ in order to make the initial pre-mixture of the process gas and the treatment reactive gas moving rapidly out of the pre-mixing zone 46 and into the primary containment zone 48 to minimize reaction in the pre-mixing zone 46 in favor of maximizing reaction in the primary containment zone 48. Also, the volume $V_5$ of the secondary containment zone 50 in relation to $V_4$ is in the range of $2V_5 \leq V_4 \leq 8V_5$. The volume $V_2$ of the diffusion zone 44 in relation to $V_3$ is $V_2 \leq V_3$.

In some situations, the available space may be so limited that only reactive chemical confinement systems with very small primary containment zone 48 volume $V_4$ can be accommodated with the result that not much solid reaction byproduct can accumulate in the primary containment zone 48 volume $V_4$ before it has to be cleaned. In such situations, an automatic interim vacuum cleaning system, as shown for example, in FIGS. 39 and 40 can be used to prolong time periods between having to disassemble and clean the reactive chemical containment system components.

Figure 39:
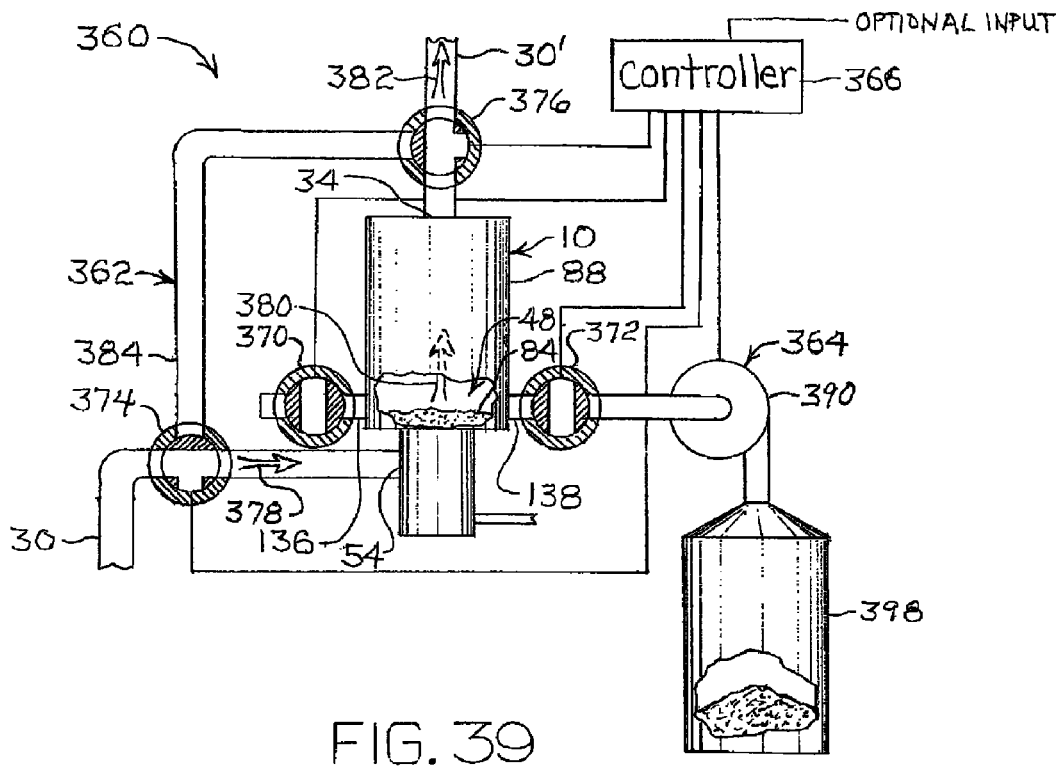
FIG. 39 is a diagrammatic representation of an interim vacuum cleaning system for the primary containment chamber with values set in normal operating mode.

As shown in FIG. 39, the example automatic interim vacuum cleaning system 360 for any of the reactive chemical containment system devices described above (e.g., devices 10, 150, etc.), includes an isolation and bypass system 362 and a vacuum cleaning system 364, both of which are operated automatically by a controller 366. Essentially, upon command by the controller 366, the isolation and bypass 362 temporarily isolates and takes the reactive chemical containment system device (e.g., device 10 or 150 described above) off-line and out of operation while the vacuum cleaning system sucks accumulated solid reaction byproduct (e.g., accumulated byproduct 84 from device 10 or accumulated byproduct 180 from device 150) out of the primary containment chamber 46. For simplicity and to avoid tiresome, redundant repetitions for different example devices, this description of the automatic interim vacuum cleaning system 360 will proceed with reference to its application on the example reactive chemical containment system device 10, but with the understanding that it is equally applicable to the example device 150 and others as well.

As mentioned above, the reactive chemical containment system device 10 has two cleanout ports 136, 138 preferably, but not essentially, on diametrically opposite sides of the primary containment chamber housing 88. A motor or solenoid operated shutoff valve is connected to each of the cleanout ports 136, 138, e.g., shutoff valve 370 connected to cleanout port 136 and shutoff valve 372 connected to cleanout port 138, as part of the vacuum cleaning system 364. In the normal operating mode for the reactive chemical containment system device 10, as described above, the vacuum cleaning system 364 is turned off and dormant, and these valves 370, 372 are shut to keep the primary containment chamber 48 closed to the outside or room environment. At the same time, two three-way valves 374, 376, which are part of the isolation and bypass system 362 are positioned to direct fluid flow in a normal manner to, through, and out of the device 10. The valve 374 is in the exhaust line 30 leading to the inlet opening 54 and the other valve 376 is in the exhaust line 30' after the outlet opening 34. Therefore, in the normal operating mode, the three-way valves 374, 376 of the isolation and bypass system 360 direct fluid flow through the upstream exhaust line 30, through the device 10, and out the downstream exhaust line 30', as indicated by the flow arrows 378, 380, 382 in FIG. 39. In this normal operating mode, the reactive chemical containment system device 10 operates to react process gas with a treatment reactive gas to produce a solid byproduct, thereby removing the process gas from the gas flow, and some of the solid byproduct accumulates in the primary containment chamber 48 as indicated diagrammatically by the accumulated byproduct 84 in FIG. 39.

Figure 40:
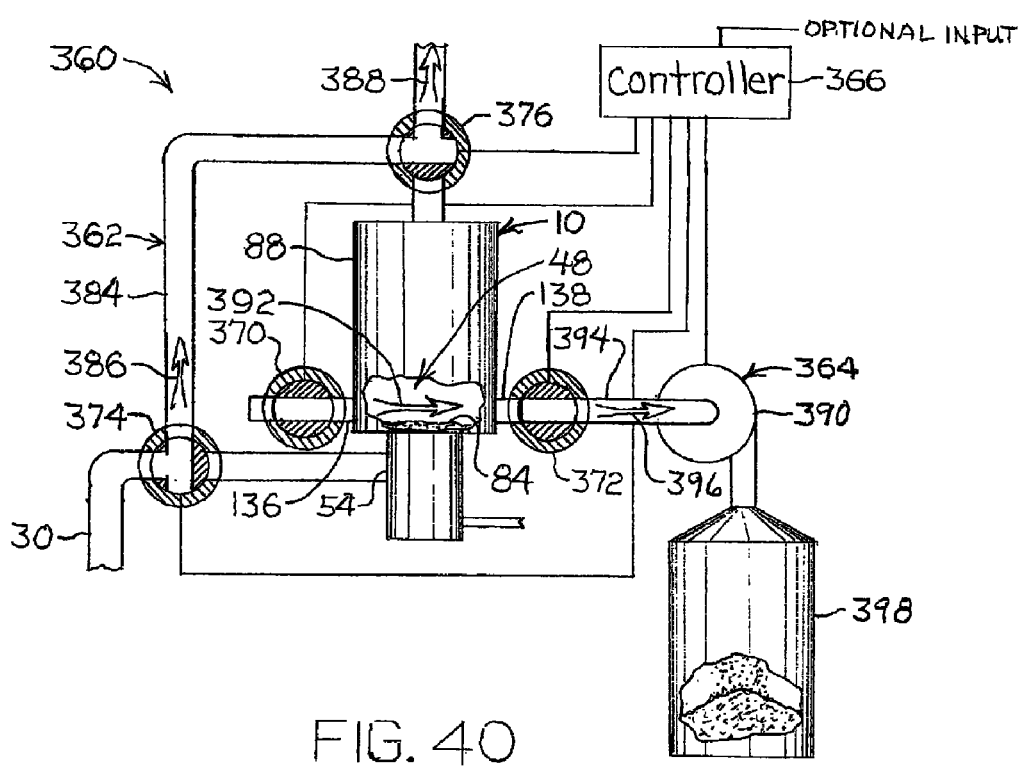
FIG. 40 is a diagrammatic view of the interim vacuum cleaning system of FIG. 39, but with the values set for bypass and vacuum cleaning mode.

At particular times for interim vacuum cleaning to remove at least some of the accumulated byproduct 84 from the primary containment chamber 48, the controller 366 sends signals to actuate the motorized or solenoid-driven, three-way valves 374, 376 of the isolation and bypass system 362 to divert the fluid flow out of the upstream exhaust line 30, through a bypass line 384 extending between the valves 374, 376, and back into the downstream exhaust line 30', as indicated by the flow arrows 386, 388 in FIG. 40. With the three-way valves 374, 376 in these diverting modes, the reactive chemical containment system device 10 is isolated from the fluid flow in the exhaust line 30, as indicated diagrammatically by the three-way valves 374, 376 in FIG. 40.

At the same time, or after a slight delay to allow time for the isolation of the device 10 by the three-way valves 374, 376 to be accomplished, the controller 366 also sends signals to open the shutoff valves 370, 372 and to start the vacuum cleaner blower 390. With the shutoff valves 370, 372 open, as indicated diagrammatically in FIG. 40, the vacuum cleaner blower 390 sucks air through the cleanout port 136 and through the primary containment chamber 48, as indicated by flow arrow 392. The air flow 392 picks up accumulated solid particles or powder 84 in the primary containment chamber 48 and carries it out of the cleanout port 138, through the vacuum line 394 as indicated by flow arrow 396, through the flower 390, and dumps it into a vacuum cleaner bag or canister 398, as indicated diagrammatically in FIG. 40.

After a short period of time for vacuum cleaning at least some of the solid byproduct 84 out of the primary containment chamber 48, the controller 366 sends signals to turn off the blower 390, and to reset the shutoff valves 370, 372 to their shut modes shown in FIG. 39, and to reset the three-way valves 374, 376 to their normal operating modes shown in FIG. 39 to return the device 10 to its normal operation. The controller 366 can be any of a variety of computes, CPUs, or microprocessors that can be programmed to signal the valves and blower to switch to the modes as described above, or it could even be a simple timing circuit, any of which would be understood by persons skilled in the art, once they understand the principles of the invention. The controller 366 can initiate and execute the bypass and isolation mode and start the vacuum cleaning mode at preset time intervals or in response to any other manual or automatic optional input, such as, for example, a pressure sensor (not shown) that would sense a back pressure in the exhaust line 30 or an excessive pressure in the deposition chamber 12 (FIG. 1) which may indicate the accumulation of byproduct 84 in the primary containment chamber 48 is clogging or impeding fluid flow. The duration of each vacuum cleaning cycle can be for a set time or based on any other optional manual or automatic input. The vacuum cleaner bag or bin 398 is preferably large enough to hold all of the byproduct sucked out of the primary containment chamber 48 in whatever number of times the vacuum cleaning system is actuated and used between programmed or preventative maintenance cycles, when the device 10 may be disassembled for thorough cleaning and the vacuum bag or bin 398 can be emptied.

The foregoing description provides examples that illustrate the principles of the invention, which is defined by the features that follow. Since numerous insignificant modifications and changes will readily occur to those skilled in the art once they understand the invention, it is not desired to limit the invention to the exact example constructions and processes shown and described above. Also, either the integrated solenoid pilot valve feature, the axial pilot valve and piston arrangement, or the elastomer valve seat seal feature can be used independently of each other, if desired. Accordingly, resort may be made to all suitable combinations, subcombinations, modifications, and equivalents that fall within the scope of the invention as defined by the features. The words "comprise," "comprises," "comprising," "include," "including," and "includes" when used in this specification, including the features, are intended to specify the presence of stated features, integers, components, or steps, but they do not preclude the presence or addition of one or more other features, integers, components, steps, or groups thereof. The terms upper, upwardly, lower, bottom, top, down, downwardly, vertical, horizontal, and other directional terms in this description are in reference to the diagrammatic orientations depicted in the drawings and are only used for convenience and clarity in this description unless otherwise indicated. They are not intended to limit the valve 10 to any particular orientation in real use applications, and, in fact, the isolation valves with corrosion protected and heat transfer enhanced valve actuator and closure apparatus can be positioned and used in any desired orientation.

The statements below show some, but not all, example relationships, categories, or aspects of features described above, which may include, for example, but not for limitation:

1. Reactive chemical containment system, comprising:

a primary containment chamber in which a process gas and a treatment reactive gas in a gas flow can be dispersed, mixed, and reacted together to produce solid reaction byproduct to thereby remove at least some of the process gas from the gas flow;

a pre-mixing zone upstream from the primary containment chamber in which the process gas and the treatment reactive gas are combined together in a common gas flow into the primary containment chamber;

means for diffusing the treatment reactive gas uniformly in the pre-mixing zone; and means for flowing the process gas into the pre-mixing zone.

2. The reactive chemical containment system of Feature 1, including:

a secondary containment zone downstream from the primary containment chamber in which any of the process gas that does not get reacted in the primary containment chamber and remains in the gas flow into the secondary containment zone can be dispersed, mixed, and reacted together with treatment reactive gas in the gas flow that also was not reacted in the primary containment chamber to produce more of the solid reaction byproduct to remove the rest of the process gas that flows as part of the gas flow from the primary containment chamber into the secondary containment zone.

3. The reactive chemical containment system of feature 2, including means in the primary containment chamber for creating turbulence in the gas flow and for dispersing the process gas and treatment reactive gas in the primary containment chamber to enhance or force reaction of the process gas and the treatment reactive gas together.

4. The reactive chemical containment system of feature 3, including means in the secondary containment chamber for creating turbulence in the gas flow and for dispersing the process gas and treatment reactive gas in the secondary containment chamber to enhance or force reaction of the process gas and the treatment reactive gas together.

5. The reactive chemical containment system of feature 4, wherein the means for creating turbulence in the gas flow and for dispersing the process gas and treatment reactive gas in the primary containment chamber includes a medium that has a large surface area and makes a tortuous path for gas flow through the medium sufficiently to create turbulence in the gas flow.

6. The reactive chemical containment system of feature 5, wherein the means for creating turbulence includes wire mesh.

7. The reactive chemical containment system of feature 6, wherein the wire mesh is shaped in a tapered configuration.

8. The reactive chemical containment system of feature 7, wherein the tapered configuration is narrower at its front or upstream end than at its back or downstream end.

9. The reactive chemical containment system of feature 8, wherein the tapered configuration comprises two or more cylindrical mesh components of different diameters stacked together in cylindrical mesh tiers.

10. The reactive chemical containment system of feature 7, wherein the wire mesh is shaped in a conical configuration.

11. The reactive chemical containment system of feature 5, wherein the means for creating turbulence includes a plurality of perforated plates spaced apart from each other in the flow path of the gas flow in the primary containment chamber.

12. The reactive chemical containment system of feature 11, wherein the perforations are larger in the upstream plate and are successively smaller in the successively downstream plates.

13. The reactive chemical containment system of feature 12, wherein the perforations in downstream plates do not all align axially with perforations in the plates that are immediately upstream from them.

14. The reactive chemical containment system of feature 11, wherein the perforated conical plates are flat.

15. The reactive chemical containment system of feature 11, wherein the perforated conical plates are cone-shaped.

16. The reactive chemical containment system of feature 15, wherein successively downstream ones of the conical perforated plates are larger in diameter than respective immediately upstream conical plates.

17. The reactive chemical containment system of feature 5, wherein the means for creating turbulence includes a plurality of perforated cylindrical sheets of different diameters positioned concentrically in relation to each other.

18. The reactive chemical containment system of feature 17, wherein the ends of the perforated cylindrical sheets are closed to force the gas flow serially through all of the perforated cylindrical sheets.

19. The reactive chemical containment system of feature 5, wherein the means for creating turbulence includes a plurality of cylindrical barrels of different diameters positioned concentrically in relation to each other with alternately closed ends and spaces between open ends and closed ends to form a labyrinth flow path through the annular spaces between the adjacent barrels.

20. The reactive chemical containment system of feature 5, wherein the means for creating turbulence includes a honeycomb core.

21. The reactive chemical containment system of feature 20, wherein the honeycomb core fills a cylindrical barrel that is open at its upstream and downstream ends so that the gas flow is directed through the honeycomb core.

22. The reactive chemical containment system of feature 21, wherein the honeycomb core is comprised of a plurality of honeycomb plates stacked on one another.

23. The reactive chemical containment system of feature 22, wherein the honeycomb cells of the honeycomb plates are laterally offset from the honeycomb cells of the adjacent honeycomb plates.

24. The reactive chemical containment system of feature 5, wherein the means for creating turbulence includes a brush-like structure.

25. The reactive chemical containment system of feature 24, wherein the brush-like structure includes a plurality of bristles extending radially outward from a longitudinal rod.

26. The reactive chemical containment system of feature 25, wherein the bristles include wire bristles.

27. The reactive chemical containment system of feature 5, wherein the means for creating turbulence includes means for cooling or heating a constituent of the gas flow.

28. The reactive chemical containment system of feature 27, wherein the means for cooling or heating a constituent of the gas flow includes a coil of tube through which a cooling or heating fluid can flow.

29. The reactive chemical containment system of feature 28, wherein the coil of tube is tapered.

30. The reactive chemical containment system of feature 29, wherein the tapered coil of tube comprises spiral-wound loops of the tube.

31. The reactive chemical containment system of feature 30, wherein each successive loop of the tube has a space between it and the preceding loop.

32. The reactive chemical containment system of feature 31, wherein each successive loop from upstream to downstream has successively larger diameters than the preceding loop so that the taper is from narrow at the upstream end of the tapered coil to wider at the downstream end of the tapered coil.

33. The reactive chemical containment system of feature 31, wherein each successive loop from upstream to downstream has successively smaller diameters than the preceding loop so that the taper is from wider at the upstream end of the tapered coil to narrower at the downstream end of the tapered coil.

34. The reactive chemical containment system of feature 28, wherein the means for creating turbulence also includes one or more perforated plates combined with the coil of tube.

35. The reactive chemical containment system of feature 34, wherein the perforated plates are mounted in longitudinally spaced relation to the coil of tube.

36. The reactive chemical containment system of feature 35, wherein the perforated plates are positioned downstream from the coil of tube.

37. The reactive chemical containment system of feature 35, wherein the perforated plates are positioned upstream from the coil of tube.

38. The reactive chemical containment system of feature 7, wherein the secondary containment zone is positioned concentrically inside the tapered wire mesh.

39. The reactive chemical containment system of feature 38, including means positioned in the secondary containment zone for creating turbulence in the gas flow in the secondary containment zone.

40. The reactive chemical containment system of feature 39, wherein the means for creating turbulence in the gas flow in the secondary containment zone includes a cylindrical element with a medium comprising multiple surfaces spaced to create turbulence in the gas flow.

41. The reactive chemical containment system of feature 40, wherein the medium comprises a roll of mesh fabric.

42. The reactive chemical containment system of feature 40, wherein the medium comprises a plurality of concentrically positioned cylindrical screens.

43. The reactive chemical containment system of feature 40, wherein the medium comprises a plurality of perforated cylindrical sheets.

44. The reactive chemical containment system of feature 40, wherein the medium comprises a pleated, perforated sheet folded and rolled into a cylindrical shape.

45. The reactive chemical containment system of feature 40, wherein the medium comprises a plurality of elongated leaves of material tied together in a cylindrical roll with surfaces of adjacent leaves spaced angularly apart from each other.

46. The reactive chemical containment system of feature 5, wherein the secondary containment zone is positioned longitudinally downstream from the primary containment chamber.

47. The reactive chemical containment system of feature 46, including means in the secondary containment zone for creating turbulence in the gas flow.

48. The reactive chemical containment system of feature 47, wherein the means for creating turbulence in the gas flow in the secondary containment zone includes a cylindrical element with a medium comprising multiple surfaces spaced to create turbulence in the gas flow.

49. The reactive chemical containment system of feature 47, wherein the medium comprises a roll of mesh fabric.

50. The reactive chemical containment system of feature 47, wherein the medium comprises a plurality of concentrically positioned cylindrical screens.

51. The reactive chemical containment system of feature 47, wherein the medium comprises a plurality of perforated cylindrical sheets.

52. The reactive chemical containment system of feature 47, wherein the medium comprises a pleated, perforated sheet folded and rolled into a cylindrical shape.

53. The reactive chemical containment system of feature 47, wherein the medium comprises a plurality of elongated leaves of material tied together in a cylindrical roll with surfaces of adjacent leaves spaced angularly apart from each other.

54. The reactive chemical containment system of feature 1, wherein means for diffusing the treatment reactive gas uniformly in the pre-mixing zone includes a diffusion plate with a plurality of diffusion apertures dispersed around the diffusion plate a radial distance outwardly from the center of the diffusion plate, and means for injecting treatment reactive gas adjacent the diffusion plate, wherein said diffusion plate is positioned between the means for injecting treatment reactive gas and the pre-mixing zone so that the treatment reactive gas has to flow through the diffusion apertures in the diffusion plate to reach the pre-mixing zone.

55. The reactive chemical containment system of feature 54, wherein the means for injecting treatment reactive gas adjacent the diffusion plate includes a nozzle extending through the diffusion plate.

56. The reactive chemical containment system of feature 1, including an elongated pre-mixing chamber positioned upstream from and connected in gas flow relation with the primary containment chamber, wherein the pre-mixing zone is in the pre-mixing chamber, the means for flowing the process gas into the pre-mixing zone includes an inlet opening into the pre-mixing chamber positioned for flowing the process gas into the pre-mixing chamber.

57. The reactive chemical containment system of feature 56, including an entry zone in the pre-mixing chamber adjacent the inlet opening where the process gas enters the pre-mixing chamber.

58. The reactive chemical containment system of feature 57, wherein the means for diffusing the treatment reactive gas uniformly in the pre-mixing zone is positioned in the pre-mixing chamber upstream from the inlet opening.

59. The reactive chemical containment system of feature 58, wherein the means for diffusing the treatment reactive gas uniformly in the pre-mixing zone includes means for injecting treatment reactive gas into the pre-mixing chamber and means for dispersing the treatment reactive gas in a diffusion zone in the pre-mixing chamber.

60. The reactive chemical containment system of feature 59, wherein the entry zone is between the diffusion zone and the pre-mixing zone.

61. The reactive chemical containment system of feature 60, wherein the means for dispersing the treatment reactive gas in the diffusion zone is positioned between the means for injecting treatment reactive gas into the pre-mixing chamber and the entry zone.

62. The reactive chemical containment system of feature 60, wherein the means for dispersing the treatment reactive gas in the diffusion zone is positioned between the means for injecting treatment reactive gas into the pre-mixing chamber and the inlet opening.

63. The reactive chemical containment system of feature 62, wherein the means for means for dispersing the treatment reactive gas in the diffusion zone includes a diffusion plate with a plurality of diffusion apertures dispersed around the diffusion plate a radial distance outwardly from the center of the diffusion plate so that the treatment reactive gas has to flow through the apertures in the diffusion plate to reach the pre-mixing zone.

64. The reactive chemical containment system of feature 63, wherein the means for injecting treatment reactive gas adjacent the diffusion plate includes a nozzle extending through the diffusion plate.

65. The reactive chemical containment system of feature 63, wherein the means for injecting treatment reactive gas adjacent the diffusion plate includes a nozzle extending through a pre-mixing chamber housing that encloses the pre-mixing chamber to a position adjacent the diffusion plate.

66. The reactive chemical containment system of feature 63, wherein the diffusion plate is positioned in the pre-mixing chamber longitudinally upstream from the entry zone and the pre-mixing zone.

67. The reactive chemical containment system of feature 63, wherein the diffusion plate is positioned concentrically around the inlet opening.

68. The reactive chemical containment system of feature 63, wherein the diffusion plate is positioned diametrically across the pre-mixing chamber from the inlet opening.

69. The reactive chemical containment system of feature 62, wherein the means for means for dispersing the treatment reactive gas in the diffusion zone includes a diffusion duct encircling the pre-mixing chamber with a plurality of diffusion apertures dispersed angularly around the diffusion duct so that the treatment reactive gas has to flow from the duct through the diffusion apertures into the pre-mixing chamber to reach the pre-mixing zone.

70. The reactive chemical containment system of feature 69, wherein the diffusion duct is positioned longitudinally upstream from the inlet opening.

71. The reactive chemical containment system of feature 69, wherein the diffusion duct is positioned longitudinally downstream from the inlet opening.

72. The reactive chemical containment system of feature 2, including means for interim cleaning solid particulate and/or powder reaction byproduct out of the primary containment chamber.

73. The reactive chemical containment system of feature 72, wherein the means for interim cleaning includes means for isolating the primary containment chamber, the pre-mixing zone, and the secondary containment zone from the process gas flow, and means for vacuum cleaning the solid particulate and/or powder reaction byproduct out of the primary containment chamber.

74. The reactive chemical containment system of feature 73, wherein the process gas flow is connected by an upstream exhaust line to a pre-mixing chamber that includes the pre-mixing zone, and the gas flow treated by reaction in the primary containment chamber and in the secondary containment chamber exits the secondary containment chamber into a downstream exhaust line, and wherein the means for isolating the primary containment chamber, the pre-mixing zone, and the secondary containment zone includes isolation valve means for closing the gas flow from the upstream exhaust line into the pre-mixing chamber and for closing the secondary containment chamber to the downstream exhaust line.

75. The reactive chemical containment system of feature 74, wherein the isolation valve means includes a inlet isolation valve for closing the gas flow from the upstream exhaust line into the pre-mixing chamber and an outlet isolation valve for closing the secondary containment chamber to the downstream exhaust line.

76. The reactive chemical containment system of feature 75, including inlet isolation valve actuation means for the inlet isolation valve that is responsive to a signal from a controller for actuating the inlet isolation valve, and including outlet isolation valve actuation means for the outlet isolation valve that is responsive to a signal from a controller for actuating the outlet isolation valve.

77. The reactive chemical containment system of feature 76, wherein the means for isolating the primary containment chamber, the pre-mixing zone, and the secondary containment zone includes bypass means for diverting process gas flow from the upstream exhaust line to the downstream exhaust line to bypass the primary containment chamber, the pre-mixing zone, and the secondary containment zone.

78. The reactive chemical containment system of feature 77, wherein the bypass means includes a bypass pipe connected at one end to the inlet isolation valve and at the other end to the outlet isolation valve, and where the inlet isolation valve is a three-way valve that in one mode passes process gas flow from the upstream exhaust line into the pre-mixing zone and in a second mode diverts the process gas flow from the upstream exhaust line into the bypass pipe, and, further, where the outlet isolation valve is a three-way valve that in one mode passes the gas flow from the secondary containment zone into the downstream exhaust line and in a second mode passes process gas from the bypass pipe into the downstream exhaust line.

79. The reactive chemical containment system of feature 78, including inlet shut-off valve actuation means for actuating the inlet shut-off valve to open the primary containment chamber to the atmosphere and close it to the atmosphere, and outlet shut-off valve actuation means for actuating the outlet shut-off valve to open the primary containment chamber to the vacuum cleaner system and to close it to the vacuum cleaner system.

80. The reactive chemical containment system of feature 79, wherein the inlet shut-off valve actuation means and the outlet shut-off valve actuation means are responsive to a signal from a controller to open and close the inlet and outlet shut-off valves.

81. The reactive chemical containment system of feature 80, wherein any of the valve actuator means can include a motor, solenoid, diaphragm, hydraulic cylinder, pneumatic actuator, or any other actuator mechanism that can change the valve from one mode to another.

82. The reactive chemical containment system of feature 80, wherein the primary containment chamber is enclosed by a primary containment chamber housing with at least two cleanout ports, and wherein the inlet shut-off valve is positioned at one of the cleanout ports and the outlet shut-off valve is positioned at the other of the ports.

83. The reactive chemical containment system of feature 82, including a controller that sends signals to the inlet isolation valve actuator and the outlet isolation valve actuator to isolate the primary containment chamber, the pre-mixing chamber, and the secondary containment chamber from the process gas flow and to divert the process gas flow from the upstream exhaust line, through the bypass pipe, and into the downstream exhaust line, and that sends signals to the inlet shut-off valve and the outlet shut-off valve to open the primary containment chamber to the atmosphere at one port and to the vacuum cleaner system at the other port, and to send a signal to the vacuum cleaner blower to start the vacuum cleaner blower or blower motor.

84. The reactive chemical containment system of feature 83, wherein the controller is programmed to send the signals to the isolation valve actuators to switch the isolation valves before sending signals to the shut-off valve actuators and blower to switch the shut-off valves to open the primary containment chamber and turn on the vacuum cleaner blower after the primary containment chamber, pre-mixing chamber, and secondary containment chamber have been isolated from the process gas flow.

85. The reactive chemical containment system of feature 84, optionally including actuatable means for shutting off and starting the treatment reactive gas flow into the pre-mixing chamber when the primary containment chamber, pre-mixing chamber, and secondary containment chamber have been isolated and the vacuum cleaning system has been started.

86. The reactive chemical containment system of feature 2, wherein the relationship between the volume of the primary containment zone ($V_4$) and the volume of the pre-mixing zone ($V_3$) is in a range of $4V_3 \leq V_4 \leq 10V_3$.

87. The reactive chemical containment system of feature 2, wherein the relationship between the volume of the primary containment zone ($V_4$) and the volume of the secondary containment zone ($V_5$) is in a range of $2V_5 \leq V_4 \leq 8V_5$.

88. The reactive chemical containment system of feature 2, wherein the relationship between the volume of the pre-mixing zone ($V_3$) and the volume of the diffusion zone ($V_2$) is $V_2 \leq V_3$.

89. The reactive chemical containment system of feature 2, wherein the overall length (L) from the means for diffusing the reactive gas uniformly in the pre-mixing zone to an outlet from the secondary containment zone is in a range of $12" \leq L \leq 72"$ (30 cm $\leq L \leq$ 183 cm).

90. The reactive chemical containment system of feature 2, wherein the diameter of the means for flowing the process gas into the pre-mixing chamber ($D_1$) is in a range of $1" \leq D_1 \leq 6"$ (2.5 cm $\leq D_1 \leq$ 15 cm).

91. The reactive chemical containment system of feature 2, wherein the diameter of the primary containment chamber ($D_4$) is in a range of $2" \leq D_4 \leq 48"$ (5 cm $\leq D_4 \leq$ 123 cm).

92. The reactive chemical containment system of feature 2, wherein the diameter of an outlet from the secondary containment zone ($D_6$) is in a range of $1" \leq D_6 \leq 6"$ (2.5 cm $\leq D_6 \leq$ 15 cm).

93. The reactive chemical containment system of feature 2, wherein the relationship between the diameter of a diffusion zone ($D_2$) upstream from the pre-mixing zone and the diameter of the means for flowing the process gas into the pre-mixing chamber ($D_1$) is in a range of $D_1 \leq D_2 \leq 6D_1$.

94. The reactive chemical containment system of feature 2, wherein the relationship between the diameter of the pre-mixing zone ($D_3$) and the diameter of the means for flowing the process gas into the pre-mixing chamber ($D_1$) is in a range of $D_1 \leq D_3 \leq 6D_1$.

95. The reactive chemical containment system of feature 2, wherein the relationship between the diameter of the primary containment chamber ($D_4$) and the diameter of the means for flowing the process gas into the pre-mixing chamber ($D_1$) is in a range of $2D_1 \leq D_4 \leq 12D_1$.

96. The reactive chemical containment system of feature 2, wherein the relationship between the diameter of the secondary containment chamber ($D_5$) and the diameter of the means for flowing the process gas into the pre-mixing chamber ($D_1$) is in a range of $2D_1 \leq D_5 \leq 6D_1$.

97. Reactive chemical containment apparatus, comprising:
a primary containment chamber in which a process gas and a treatment reactive gas in a gas flow can be dispersed, mixed, and reacted together to produce solid reaction byproduct to thereby remove at least some of the process gas from the gas flow;
a pre-mixing zone upstream from the primary containment chamber in which the process gas and the treatment reactive gas are combined together in a common gas flow into the primary containment chamber;
a diffusion zone upstream from the pre-mixing zone;
a treatment reactive gas inlet positioned to the treatment reactive gas into the diffusion zone; and
a process gas inlet positioned to direct the process gas into the pre-mixing zone.

98. The reactive chemical containment apparatus of feature 97, including:
a secondary containment chamber downstream from the primary containment chamber in which any of the process gas that does not get reacted in the primary containment chamber and remains in the gas flow into the secondary containment chamber can be dispersed, mixed, and reacted together with treatment reactive gas in the gas flow that also was not reacted in the primary containment chamber to produce more of the solid reaction byproduct to remove the rest of the process gas that flows as part of the gas flow from the primary containment chamber into the secondary containment chamber.

99. The reactive chemical containment apparatus of feature 98, including a primary insert in the primary containment chamber that is sized and shaped to create turbulence in the gas flow.

100. The reactive chemical containment apparatus of feature 99, including a secondary insert in the secondary containment chamber that is sized and shaped to create turbulence in the gas flow.

101. The reactive chemical containment apparatus of feature 99, wherein the primary insert includes wire mesh.

102. The reactive chemical containment apparatus of feature 101, wherein the wire mesh is shaped in a tapered configuration.

103. The reactive chemical containment apparatus of feature 102, wherein the tapered configuration is narrower at its front or upstream end than at its back or downstream end.

104. The reactive chemical containment apparatus of feature 103, wherein the tapered configuration comprises two or more cylindrical mesh components of different diameters stacked together in cylindrical mesh tiers.

105. The reactive chemical containment apparatus of feature 103, wherein the wire mesh is shaped in a conical configuration.

106. The reactive chemical containment apparatus of feature 99, wherein the primary insert includes a plurality of perforated plates spaced apart from each other in the flow path of the gas flow in the primary containment chamber.

107. The reactive chemical containment apparatus of feature 106, wherein the perforations are larger in the upstream plate and are successively smaller in the successively downstream plates.

108. The reactive chemical containment apparatus of feature 107, wherein the perforations in downstream plates do not all align axially with perforations in the plates that are immediately upstream from them.

109. The reactive chemical containment apparatus of feature 106, wherein the perforated conical plates are flat.

110. The reactive chemical containment apparatus of feature 106, wherein the perforated conical plates are cone-shaped.

111. The reactive chemical containment apparatus of feature 110, wherein successively downstream ones of the conical perforated plates are larger in diameter than respective immediately upstream conical plates.

112. The reactive chemical containment apparatus of feature 99, wherein the primary insert includes a plurality of perforated cylindrical sheets of different diameters positioned concentrically in relation to each other.

113. The reactive chemical containment apparatus of feature 112, wherein the ends of the perforated cylindrical sheets are closed to force the gas flow serially through all of the perforated cylindrical sheets.

114. The reactive chemical containment apparatus of feature 99, wherein the primary insert includes a plurality of cylindrical barrels of different diameters positioned concentrically in relation to each other with alternately closed ends and spaces between open ends and closed ends to form a labyrinth flow path through the annular spaces between the adjacent barrels.

115. The reactive chemical containment apparatus of feature 99, wherein the primary insert includes a honeycomb core.

116. The reactive chemical containment apparatus of feature 115, wherein the honeycomb core fills a cylindrical barrel that is open at its upstream and downstream ends so that the gas flow is directed through the honeycomb core.

117. The reactive chemical containment apparatus of feature 116, wherein the honeycomb core is comprised of a plurality of honeycomb plates stacked on one another.

118. The reactive chemical containment apparatus of feature 117, wherein the honeycomb cells of the honeycomb plates are laterally offset from the honeycomb cells of the adjacent honeycomb plates.

119. The reactive chemical containment apparatus of feature 99, wherein the primary insert includes a brush-like structure.

120. The reactive chemical containment apparatus of feature 119, wherein the brush-like structure includes a plurality of bristles extending radially outward from a longitudinal rod.

121. The reactive chemical containment apparatus of feature 120, wherein the bristles include wire bristles.

122. The reactive chemical containment apparatus of feature 99, wherein the primary insert includes a coil of tube through which a cooling or heating fluid can flow.

123. The reactive chemical containment apparatus of feature 122, wherein the coil of tube is tapered.

124. The reactive chemical containment apparatus of feature 123, wherein the tapered coil of tube comprises spiral-wound loops of the tube.

125. The reactive chemical containment apparatus of feature 124, wherein each successive loop of the tube has a space between it and the preceding loop.

126. The reactive chemical containment apparatus of feature 125, wherein each successive loop from upstream to downstream has successively larger diameters than the preceding loop so that the taper is from narrow at the upstream end of the tapered coil to wider at the downstream end of the tapered coil.

127. The reactive chemical containment apparatus of feature 99, wherein the primary insert includes one or more perforated plates combined with a coil of tube.

128. The reactive chemical containment apparatus of feature 127, wherein the perforated plates are positioned downstream from the coil of tube.

129. The reactive chemical containment apparatus of feature 127, wherein the perforated plates are positioned upstream from the coil of tube.

130. The reactive chemical containment apparatus of feature 103, wherein the secondary containment chamber is positioned concentrically inside the tapered wire mesh.

131. The reactive chemical containment apparatus of feature 130, including a secondary insert positioned in the secondary containment chamber for creating turbulence in the gas flow in the secondary containment chamber.

132. The reactive chemical containment apparatus of feature 131, wherein the secondary insert includes a cylindrical element with a medium comprising multiple surfaces spaced to create turbulence in the gas flow.

133. The reactive chemical containment apparatus of feature 132, wherein the medium comprises a roll of mesh fabric.

134. The reactive chemical containment apparatus of feature 132, wherein the medium comprises a plurality of concentrically positioned cylindrical screens.

135. The reactive chemical containment apparatus of feature 132, wherein the medium comprises a plurality of perforated cylindrical sheets.

136. The reactive chemical containment apparatus of feature 132, wherein the medium comprises a pleated, perforated sheet folded and rolled into a cylindrical shape.

137. The reactive chemical containment apparatus of feature 132, wherein the medium comprises a plurality of elongated leaves of material tied together in a cylindrical roll with surfaces of adjacent leaves spaced angularly apart from each other.

138. The reactive chemical containment system of feature 100, wherein the secondary containment chamber is positioned longitudinally downstream from the primary containment chamber.

139. The reactive chemical containment apparatus of feature 138, including a secondary insert positioned in the secondary containment chamber for creating turbulence in the gas flow in the secondary containment chamber.

140. The reactive chemical containment apparatus of feature 139, wherein the secondary insert includes a cylindrical element with a medium comprising multiple surfaces spaced to create turbulence in the gas flow.

141. The reactive chemical containment apparatus of feature 140, wherein the medium comprises a roll of mesh fabric.

142. The reactive chemical containment apparatus of Feature 140, wherein the medium comprises a plurality of concentrically positioned cylindrical screens.

143. The reactive chemical containment apparatus of feature 140, wherein the medium comprises a plurality of perforated cylindrical sheets.

144. The reactive chemical containment apparatus of feature 140, wherein the medium comprises a pleated, perforated sheet folded and rolled into a cylindrical shape.

145. The reactive chemical containment apparatus of feature 140, wherein the medium comprises a plurality of elongated leaves of material tied together in a cylindrical roll with surfaces of adjacent leaves spaced angularly apart from each other.

146. The reactive chemical containment apparatus of feature 97, including: (i) a diffusion plate in the diffusion zone that has a plurality of diffusion apertures dispersed around the diffusion plate a radial distance outwardly from the center of the diffusion plate; and (ii) a treatment reactive gas injection nozzle adjacent the diffusion plate, wherein said diffusion plate is positioned between the treatment reactive gas injection nozzle and the pre-mixing zone so that the treatment reactive gas has to flow through the diffusion apertures in the diffusion plate to reach the pre-mixing zone.

147. The reactive chemical containment apparatus of feature 146, wherein the reactive gas injection nozzle extends through the diffusion plate.

148. The reactive chemical containment apparatus of feature 147, wherein the diffusion plate is positioned in the pre-mixing chamber longitudinally upstream from the process gas inlet and the pre-mixing zone.

149. The reactive chemical containment apparatus of feature 147, wherein the diffusion plate is positioned concentrically around the process gas inlet.

150. The reactive chemical containment apparatus of feature 63, wherein the diffusion plate is positioned diametrically across the pre-mixing chamber from the process gas inlet.

151. The reactive chemical containment apparatus of feature 97, including a diffusion duct encircling the pre-mixing chamber with a plurality of diffusion apertures dispersed angularly around the diffusion duct for flowing the treatment reactive gas from the duct through the diffusion apertures into the pre-mixing chamber.

152. The reactive chemical containment apparatus of feature 151, wherein the diffusion duct is positioned longitudinally upstream from the process gas inlet.

153. The reactive chemical containment apparatus of feature 151, wherein the diffusion duct is positioned longitudinally downstream from the process gas inlet.

154. The reactive chemical containment apparatus of feature 100, including two cleanout ports on diametrically opposite sides of the primary containment chamber.

155. The reactive chemical containment apparatus of feature 154, including a vacuum cleaner connected to one of the cleanout ports for sucking particulate chemical reaction product out of the primary containment chamber.

156. The reactive chemical containment apparatus of feature 155, including isolation valves positioned upstream from the process gas inlet and downstream from the secondary containment chamber, which, when closed to the primary and secondary containment chambers, isolate the primary and secondary containment chambers from the process gas flow.

157. The reactive chemical containment apparatus of feature 156, including cleanout valves in the cleanout ports, which when opened open the primary containment chamber to the vacuum cleaner through the one cleanout port and to the ambient atmosphere through the other cleanout port.

158. The reactive chemical containment apparatus of feature 157, including a controller in communication with actuators on the isolation valves, the cleanout valves, and the vacuum cleaner, which is operable periodically or on command to provide control signals to the actuators of the isolation valves to isolate the primary and secondary containment chambers from the process gas flow, open the cleanout ports to the vacuum cleaner and the ambient atmosphere, and turn on the vacuum cleaner to suck the particulate reaction product out of the primary containment chamber.

159. The reactive chemical containment apparatus of feature 100, wherein the relationship between the volume of the primary containment chamber ($V_4$) and the volume of the pre-mixing zone ($V_3$) is in a range of $4V_3 \leq V_4 \leq 10V_3$.

160. The reactive chemical containment apparatus of feature 100, wherein the relationship between the volume of the primary containment chamber ($V_4$) and the volume of the secondary containment chamber ($V_5$) is in a range of $2V_5 \leq V_4 \leq 8V_5$.

161. The reactive chemical containment apparatus of feature 100, wherein the relationship between the volume of the pre-mixing zone ($V_3$) and the volume of the diffusion zone ($V_2$) is $V_2 \leq V_3$.

162. The reactive chemical containment apparatus of feature 100, wherein the overall length (L) from the diffusion zone to an outlet from the secondary containment chamber is in a range of $12" \leq L \leq 72"$ (30 cm $\leq L \leq$ 183 cm).

163. The reactive chemical containment apparatus of feature 100, wherein the diameter of the process gas inlet ($D_1$) is in a range of $1" \leq D_1 \leq 6"$ (2.5 cm $\leq D_1 \leq$ 15 cm).

164. The reactive chemical containment apparatus of feature 100, wherein the diameter of the primary containment chamber ($D_4$) is in a range of $2" \leq D_4 \leq 48"$ (5 cm $\leq D_4 \leq$ 123 cm).

165. The reactive chemical containment apparatus of feature 100, wherein the diameter of an outlet from the secondary containment chamber ($D_6$) is in a range of $1" \leq D_6 \leq 6"$ (2.5 cm $\leq D_6 \leq$ 15 cm).

166. The reactive chemical containment apparatus of feature 100, wherein the relationship between the diameter of a diffusion zone ($D_2$) upstream from the pre-mixing zone and the diameter of the process gas inlet ($D_1$) is in a range of $D_1 \leq D_2 \leq 6D_1$.

167. The reactive chemical containment apparatus of feature 100, wherein the relationship between the diameter of the pre-mixing zone ($D_3$) and the diameter of the process gas inlet ($D_1$) is in a range of $D_1 \leq D_3 \leq 6D_1$.

168. The reactive chemical containment apparatus of feature 100, wherein the relationship between the diameter of the primary containment chamber ($D_4$) and the process gas inlet ($D_1$) is in a range of $2D_1 \leq D_4 \leq 12D_1$.

169. The reactive chemical containment apparatus of feature 100, wherein the relationship between the diameter of the secondary containment chamber ($D_5$) and the process gas inlet ($D_1$) is in a range of $2D_1 \leq D_s \leq 6D_1$.

170. A method of removing process gas from an exhaust line of a chemical vapor deposition system, including:

flowing the process gas from the exhaust line into an entry zone of a pre-mixing chamber;

injecting a treatment reactive gas into a diffusion zone of a pre-mixing chamber and diffusing the treatment reactive gas in the pre-mixing chamber;

allowing the process gas and the treatment reactive gas to begin mixing in a pre-mixing zone in the pre-mixing chamber as they flow into a primary containment chamber;

creating turbulence in the gas flow in the primary containment chamber to thoroughly mix the process gas and the treatment reactive gas and dispersing the mixture throughout the primary containment chamber to react as much of the process gas with the treatment reactant gas as practical in the primary containment chamber;

accumulating solid particulate or powder reaction byproduct in the primary containment chamber;

flowing the gas flow into a secondary containment zone and creating turbulence in the secondary containment zone to thoroughly mix the process gas and the treatment reactive gas and dispersing the mixture throughout the secondary containment chamber to react the remainder of the process gas in the gas flow with the treatment reactant gas;

accumulating solid particulate or powder reaction byproduct in the secondary containment chamber; and allowing the gas flow to exit the secondary reaction zone into a downstream exhaust line.

171. The method of feature 170, wherein the relationship between the volume of the primary containment chamber ($V_4$) and the volume of the pre-mixing chamber ($V_3$) is in a range of $4V_3 \leq V_4 \leq 10V_3$.

172. The method of feature 170, wherein the relationship between the volume of the primary containment chamber ($V_4$) and the volume of the secondary containment chamber ($V_5$) is in a range of $2V_5 \leq V_4 \leq 8V_5$.

173. The method of feature 170, wherein the relationship between the volume of the pre-mixing chamber ($V_3$) and the volume of the diffusion zone ($V_2$) is $V_2 \leq V_3$.

174. The method of feature 170, wherein the overall length (L) from the diffusion zone to an outlet from the secondary containment chamber is in a range of $12" \leq L \leq 72"$ (30 cm $\leq L \leq$ 183 cm).

175. The method of feature 170, wherein the diameter of the a process gas inlet into the pre-mixing chamber ($D_1$) is in a range of $1" \leq D_1 \leq 6"$ (2.5 cm $\leq D_1 \leq$ 15 cm).

176. The method of feature 170, wherein the diameter of the primary containment chamber ($D_4$) is in a range of $2" \leq D_4 \leq 48"$ (5 cm $\leq D_4 \leq$ 123 cm).

177. The method of feature 170, wherein the diameter of an outlet from the secondary containment chamber ($D_6$) is in a range of $1" \leq D_6 \leq 6"$ (2.5 cm $\leq D_6 \leq$ 15 cm).

178. The method of feature 170, wherein the relationship between the diameter of the diffusion zone ($D_2$) and the diameter of a process gas inlet into the pre-mixing chamber ($D_1$) is in a range of $D_1 \leq D_2 \leq 6D_1$.

179. The method of feature 170, wherein the relationship between the diameter of the pre-mixing chamber ($D_3$) and the diameter of a process gas inlet into the pre-mixing chamber ($D_1$) is in a range of $D_1 \leq D_3 \leq 6D_1$.

180. The method of feature 170, wherein the relationship between the diameter of the primary containment chamber ($D_4$) and the diameter of a process gas inlet into the pre-mixing chamber ($D_1$) is in a range of $2D_1 \leq D_4 \leq 12D_1$.

181. The method of feature 170, wherein the relationship between the diameter of the secondary containment chamber ($D_5$) and the diameter of the a process gas inlet into the pre-mixing chamber ($D_1$) is in a range of $2D_1 \leq D_5 \leq 6D_1$.

182. The method of feature 170, including creating the turbulence in the primary containment chamber by flowing the mixture of process gas and treatment reactive gas through a medium that has a large surface area and makes a tortuous path for gas flow through the medium sufficiently to create turbulence in the gas flow.

183. The method of feature 182, wherein the medium includes wire mesh.

184. The method of feature 183, wherein the wire mesh is shaped in a tapered configuration.

185. The method of feature 184, wherein the tapered configuration is narrower at its front or upstream end than at its back or downstream end.

186. The method of feature 185, wherein the tapered configuration comprises two or more cylindrical mesh components of different diameters stacked together in cylindrical mesh tiers.

187. The method of feature 184, wherein the medium includes a plurality of perforated plates spaced apart from each other in the flow path of the gas mixture in the primary containment chamber.

188. The method of feature 187, wherein the perforations are larger in the upstream plate and are successively smaller in the successively downstream plates.

189. The method of feature 188, wherein the perforations in downstream plates do not all align axially with perforations in the plates that are immediately upstream from them.

190. The method of feature 187, wherein the perforated conical plates are flat.

191. The method of feature 187, wherein the perforated conical plates are cone-shaped.

192. The method of feature 191, wherein successively downstream ones of the conical perforated plates are larger in diameter than respective immediately upstream conical plates.

193. The method of feature 170, including periodically or intermittently isolating the primary and secondary reaction chambers from the process gas flow and vacuuming out the solid particulate or powder reaction byproduct accumulated in the primary containment chamber.

194. The method of feature 170, including reacting the process gas with the treatment reactant gas in a non-combustible manner.

What is claimed is:

1. Reactive chemical containment apparatus, comprising:
   a primary containment chamber in which a process gas and a treatment reactive gas in a gas flow can be dispersed, mixed, and reacted together to produce solid reaction byproduct to thereby remove at least some of the process gas from the gas flow;
   a pre-mixing zone upstream from the primary containment chamber in which the process gas and the treatment reactive gas are combined together in a common gas flow into the primary containment chamber;
   a diffusion zone upstream from the pre-mixing zone;
   a treatment reactive gas inlet positioned to direct the treatment reactive gas into the diffusion zone; and
   a process gas inlet positioned to direct the process gas into the pre-mixing zone.

2. The reactive chemical containment apparatus of claim 1, including:
   a secondary containment chamber downstream from the primary containment chamber in which any of the process gas that does not get reacted in the primary containment chamber and remains in the gas flow into the secondary containment chamber can be dispersed, mixed, and reacted together with treatment reactive gas in the gas flow that also was not reacted in the primary containment chamber to produce more of the solid reaction byproduct to remove the rest of the process gas that flows as part of the gas flow from the primary containment chamber into the secondary containment chamber.

3. The reactive chemical containment apparatus of claim 2, including a primary insert in the primary containment chamber that is sized and shaped to create turbulence in the gas flow.

4. The reactive chemical containment apparatus of claim 3, including a secondary insert in the secondary containment chamber that is sized and shaped to create turbulence in the gas flow.

5. The reactive chemical containment apparatus of claim 3, wherein the primary insert includes wire mesh.

6. The reactive chemical containment apparatus of claim 5, wherein the wire mesh is shaped in a tapered configuration.

7. The reactive chemical containment apparatus of claim 6, wherein the tapered configuration is narrower at its front or upstream end than at its back or downstream end.

8. The reactive chemical containment apparatus of claim 7, wherein the tapered configuration comprises two or more cylindrical mesh components of different diameters stacked together in cylindrical mesh tiers.

9. The reactive chemical containment apparatus of claim 7, wherein the wire mesh is shaped in a conical configuration.

10. The reactive chemical containment apparatus of claim 3, wherein the primary insert includes a plurality of perforated plates spaced apart from each other in the flow path of the gas flow in the primary containment chamber.

11. The reactive chemical containment apparatus of claim 10, wherein the perforations are larger in the upstream plate and are successively smaller in the successively downstream plates.

12. The reactive chemical containment apparatus of claim 11, wherein the perforations in downstream plates do not all align axially with perforations in the plates that are immediately upstream from them.

13. The reactive chemical containment apparatus of claim 10, wherein the perforated conical plates are flat.

14. The reactive chemical containment apparatus of claim 10, wherein the perforated conical plates are cone-shaped.

15. The reactive chemical containment apparatus of claim 14, wherein successively downstream ones of the conical perforated plates are larger in diameter than respective immediately upstream conical plates.

16. The reactive chemical containment apparatus of claim 3, wherein the primary insert includes a plurality of perforated cylindrical sheets of different diameters positioned concentrically in relation to each other.

17. The reactive chemical containment apparatus of claim 16, wherein the ends of the perforated cylindrical sheets are closed to force the gas flow serially through all of the perforated cylindrical sheets.

18. The reactive chemical containment apparatus of claim 3, wherein the primary insert includes a plurality of cylindrical barrels of different diameters positioned concentrically in relation to each other with alternately closed ends and spaces between open ends and closed ends to form a labyrinth flow path through the annular spaces between the adjacent barrels.

19. The reactive chemical containment apparatus of claim 3, wherein the primary insert includes a honeycomb core.

20. The reactive chemical containment apparatus of claim 19, wherein the honeycomb core fills a cylindrical barrel that is open at its upstream and downstream ends so that the gas flow is directed through the honeycomb core.

21. The reactive chemical containment apparatus of claim 20, wherein the honeycomb core is comprised of a plurality of honeycomb plates stacked on one another.

22. The reactive chemical containment apparatus of claim 21, wherein the honeycomb cells of the honeycomb plates are laterally offset from the honeycomb cells of the adjacent honeycomb plates.

23. The reactive chemical containment apparatus of claim 3, wherein the primary insert includes a brush-like structure.

24. The reactive chemical containment apparatus of claim 23, wherein the brush-like structure includes a plurality of bristles extending radially outward from a longitudinal rod.

25. The reactive chemical containment apparatus of claim 24, wherein the bristles include wire bristles.

26. The reactive chemical containment apparatus of claim 3, wherein the primary insert includes a coil of tube through which a cooling or heating fluid can flow.

27. The reactive chemical containment apparatus of claim 26, wherein the coil of tube is tapered.

28. The reactive chemical containment apparatus of claim 27, wherein the tapered coil of tube comprises spiral-wound loops of the tube.

29. The reactive chemical containment apparatus of claim 28, wherein each successive loop of the tube has a space between it and the preceding loop.

30. The reactive chemical containment apparatus of claim 29, wherein each successive loop from upstream to downstream has successively larger diameters than the preceding loop so that the taper is from narrow at the upstream end of the tapered coil to wider at the downstream end of the tapered coil.

31. The reactive chemical containment apparatus of claim 3, wherein the primary insert includes one or more perforated plates combined with a coil of tube.

32. The reactive chemical containment apparatus of claim 31, wherein the perforated plates are positioned downstream from the coil of tube.

33. The reactive chemical containment apparatus of claim 31, wherein the perforated plates are positioned upstream from the coil of tube.

34. The reactive chemical containment apparatus of claim 7, wherein the secondary containment chamber is positioned concentrically inside the tapered wire mesh.

35. The reactive chemical containment apparatus of claim 34, including a secondary insert positioned in the secondary containment chamber for creating turbulence in the gas flow in the secondary containment chamber.

36. The reactive chemical containment apparatus of claim 35, wherein the secondary insert includes a cylindrical element with a medium comprising multiple surfaces spaced to create turbulence in the gas flow.

37. The reactive chemical containment apparatus of claim 36, wherein the medium comprises a roll of mesh fabric.

38. The reactive chemical containment apparatus of claim 36, wherein the medium comprises a plurality of concentrically positioned cylindrical screens.

39. The reactive chemical containment apparatus of claim 36, wherein the medium comprises a plurality of perforated cylindrical sheets.

40. The reactive chemical containment apparatus of claim 36, wherein the medium comprises a pleated, perforated sheet folded and rolled into a cylindrical shape.

41. The reactive chemical containment apparatus of claim 36, wherein the medium comprises a plurality of elongated leaves of material tied together in a cylindrical roll with surfaces of adjacent leaves spaced angularly apart from each other.

42. The reactive chemical containment system of claim 4, wherein the secondary containment chamber is positioned longitudinally downstream from the primary containment chamber.

43. The reactive chemical containment apparatus of claim 42, including a secondary insert positioned in the secondary containment chamber for creating turbulence in the gas flow in the secondary containment chamber.

44. The reactive chemical containment apparatus of claim 43, wherein the secondary insert includes a cylindrical element with a medium comprising multiple surfaces spaced to create turbulence in the gas flow.

45. The reactive chemical containment apparatus of claim 44, wherein the medium comprises a roll of mesh fabric.

46. The reactive chemical containment apparatus of claim 44, wherein the medium comprises a plurality of concentrically positioned cylindrical screens.

47. The reactive chemical containment apparatus of claim 44, wherein the medium comprises a plurality of perforated cylindrical sheets.

48. The reactive chemical containment apparatus of claim 44, wherein the medium comprises a pleated, perforated sheet folded and rolled into a cylindrical shape.

49. The reactive chemical containment apparatus of claim 44, wherein the medium comprises a plurality of elongated leaves of material tied together in a cylindrical roll with surfaces of adjacent leaves spaced angularly apart from each other.

50. The reactive chemical containment apparatus of claim 1, including: (i) a diffusion plate in the diffusion zone that has a plurality of diffusion apertures dispersed around the diffusion plate a radial distance outwardly from the center of the diffusion plate; and (ii) a treatment reactive gas injection nozzle adjacent the diffusion plate, wherein said diffusion plate is positioned between the treatment reactive gas injection nozzle and the pre-mixing zone so that the treatment reactive gas has to flow through the diffusion apertures in the diffusion plate to reach the pre-mixing zone.

51. The reactive chemical containment apparatus of claim 50, wherein the reactive gas injection nozzle extends through the diffusion plate.

52. The reactive chemical containment apparatus of claim 51, wherein the diffusion plate is positioned in the pre-mixing chamber longitudinally upstream from the process gas inlet and the pre-mixing zone.

53. The reactive chemical containment apparatus of claim 51, wherein the diffusion plate is positioned concentrically around the process gas inlet.

54. The reactive chemical containment apparatus of claim 51, wherein the diffusion plate is positioned diametrically across the pre-mixing chamber from the process gas inlet.

55. The reactive chemical containment apparatus of claim 1, including a diffusion duct encircling the pre-mixing chamber with a plurality of diffusion apertures dispersed angularly around the diffusion duct for flowing the treatment reactive gas from the duct through the diffusion apertures into the pre-mixing chamber.

56. The reactive chemical containment apparatus of claim 55, wherein the diffusion duct is positioned longitudinally upstream from the process gas inlet.

57. The reactive chemical containment apparatus of claim 55, wherein the diffusion duct is positioned longitudinally downstream from the process gas inlet.

58. The reactive chemical containment apparatus of claim 4, including two cleanout ports on diametrically opposite sides of the primary containment chamber.

39

59. The reactive chemical containment apparatus of claim 58, including a vacuum cleaner connected to one of the cleanout ports for sucking particulate chemical reaction product out of the primary containment chamber.

60. The reactive chemical containment apparatus of claim 59, including isolation valves positioned upstream from the process gas inlet and downstream from the secondary containment chamber, which, when closed to the primary and secondary containment chambers, isolate the primary and secondary containment chambers from the process gas flow.

61. The reactive chemical containment apparatus of claim 60, including cleanout valves in the cleanout ports, which when opened open the primary containment chamber to the vacuum cleaner through the one cleanout port and to the ambient atmosphere through the other cleanout port.

62. The reactive chemical containment apparatus of claim 61, including a controller in communication with actuators on the isolation valves, the cleanout valves, and the vacuum cleaner, which is operable periodically or on command to provide control signals to the actuators of the isolation valves to isolate the primary and secondary containment chambers from the process gas flow, open the cleanout ports to the vacuum cleaner and the ambient atmosphere, and turn on the vacuum cleaner to suck the particulate reaction product out of the primary containment chamber.

63. The reactive chemical containment apparatus of claim 4, wherein the relationship between the volume of the primary containment chamber ($V_4$) and the volume of the pre-mixing zone ($V_3$) is in a range of $4V_3 \leq V_4 \leq 10V_3$.

64. The reactive chemical containment apparatus of claim 4, wherein the relationship between the volume of the primary containment chamber ($V_4$) and the volume of the secondary containment chamber ($V_5$) is in a range of $2V_5 \leq V_4 \leq 8V_5$.

65. The reactive chemical containment apparatus of claim 4, wherein the relationship between the volume of the pre-mixing zone ($V_3$) and the volume of the diffusion zone ($V_2$) is $V_2 \leq V_3$.

66. The reactive chemical containment apparatus of claim 4, wherein the overall length (L) from the diffusion zone to an outlet from the secondary containment chamber is in a range of $12" \leq L \leq 72"$ (30 cm $\leq L \leq$ 183 cm).

67. The reactive chemical containment apparatus of claim 4, wherein the diameter of the process gas inlet ($D_1$) is in a range of $1" \leq D_1 \leq 6"$ (2.5 cm $\leq D_1 \leq$ 15 cm).

68. The reactive chemical containment apparatus of claim 4, wherein the diameter of the primary containment chamber ($D_4$) is in a range of $2" \leq D_4 \leq 48"$ (5 cm $\leq D_4 \leq$ 123 cm).

69. The reactive chemical containment apparatus of claim 4, wherein the diameter of an outlet from the secondary containment chamber ($D_6$) is in a range of $1" \leq D_6 \leq 6"$ (2.5 cm $\leq D_6 \leq$ 15 cm).

70. The reactive chemical containment apparatus of claim 4, wherein the relationship between the diameter of a diffusion zone ($D_2$) upstream from the pre-mixing zone and the diameter of the process gas inlet ($D_1$) is in a range of $D_1 \leq D_2 \leq 6D_1$.

71. The reactive chemical containment apparatus of claim 4, wherein the relationship between the diameter of the pre-mixing zone ($D_3$) and the diameter of the process gas inlet ($D_1$) is in a range of $D_1 \leq D_3 \leq 6D_1$.

72. The reactive chemical containment apparatus of claim 4, wherein the relationship between the diameter of the primary containment chamber ($D_4$) and the process gas inlet ($D_1$) is in a range of $2D_1 \leq D_4 \leq 12D_1$.

73. The reactive chemical containment apparatus of claim 4, wherein the relationship between the diameter of the secondary containment chamber ($D_5$) and the process gas inlet ($D_1$) is in a range of $2D_1 \leq D_5 \leq 6D_1$.

74. Reactive chemical containment system, comprising:
a primary containment chamber in which a process gas and a treatment reactive gas in a gas flow can be dispersed, mixed, and reacted together to produce solid reaction byproduct to thereby remove at least some of the process gas from the gas flow;
a pre-mixing zone upstream from the primary containment chamber in which the process gas and the treatment reactive gas are combined together in a common gas flow into the primary containment chamber;
means for diffusing the treatment reactive gas uniformly in the pre-mixing zone; and
means for flowing the process gas into the pre-mixing zone.

75. The reactive chemical containment system of claim 74, including:
a secondary containment zone downstream from the primary containment chamber in which any of the process gas that does not get reacted in the primary containment chamber and remains in the gas flow into the secondary containment zone can be dispersed, mixed, and reacted together with treatment reactive gas in the gas flow that also was not reacted in the primary containment chamber to produce more of the solid reaction byproduct to remove the rest of the process gas that flows as part of the gas flow from the primary containment chamber into the secondary containment zone.

76. The reactive chemical containment system of claim 75, including means in the primary containment chamber for creating turbulence in the gas flow and for dispersing the process gas and treatment reactive gas in the primary containment chamber to enhance or force reaction of the process gas and the treatment reactive gas together.

77. The reactive chemical containment system of claim 76, including means in the secondary containment chamber for creating turbulence in the gas flow and for dispersing the process gas and treatment reactive gas in the secondary containment chamber to enhance or force reaction of the process gas and the treatment reactive gas together.

78. The reactive chemical containment system of claim 74, wherein the means for diffusing the treatment reactive gas uniformly in the pre-mixing zone includes a diffusion plate with a plurality of diffusion apertures dispersed around the diffusion plate a radial distance outwardly from the center of the diffusion plate, and means for injecting treatment reactive gas adjacent the diffusion plate, wherein said diffusion plate is positioned between the means for injecting treatment reactive gas and the pre-mixing zone so that the treatment reactive gas has to flow through the diffusion apertures in the diffusion plate to reach the pre-mixing zone.

79. The reactive chemical containment system of claim 74, wherein the means for diffusing the treatment reactive gas uniformly in the pre-mixing zone includes means for injecting treatment reactive gas into the pre-mixing chamber and means for dispersing the treatment reactive gas in a diffusion zone in the pre-mixing chamber.

80. The reactive chemical containment system of claim 75, including means for interim cleaning solid particulate and/or powder reaction byproduct out of the primary containment chamber.

81. The reactive chemical containment system of claim 80, wherein the means for interim cleaning includes means for isolating the primary containment chamber, the pre-mixing zone, and the secondary containment zone from the process gas flow, and means for vacuum cleaning the solid particulate and/or powder reaction byproduct out of the primary containment chamber.

82. The reactive chemical containment system of claim 81, wherein the means for isolating the primary containment chamber, the pre-mixing zone, and the secondary containment zone includes bypass means for diverting process gas flow from the upstream exhaust line to the downstream exhaust line to bypass the primary containment chamber, the pre-mixing zone, and the secondary containment zone.

83. A method of removing process gas from an exhaust line of a chemical vapor deposition system, including:
    flowing the process gas from the exhaust line into an entry zone of a pre-mixing chamber;
    injecting a treatment reactive gas into a diffusion zone of a pre-mixing chamber and diffusing the treatment reactive gas in the pre-mixing chamber;
    allowing the process gas and the treatment reactive gas to begin mixing in a pre-mixing zone in the pre-mixing chamber as they flow into a primary containment chamber;
    creating turbulence in the gas flow in the primary containment chamber to thoroughly mix the process gas and the treatment reactive gas and dispersing the mixture throughout the primary containment chamber to react as much of the process gas with the treatment reactant gas as practical in the primary containment chamber;
    accumulating solid particulate or powder reaction byproduct in the primary containment chamber;
    flowing the gas flow into a secondary containment zone and creating turbulence in the secondary containment zone to thoroughly mix the process gas and the treatment reactive gas and dispersing the mixture throughout the secondary containment chamber to react the remainder of the process gas in the gas flow with the treatment reactant gas;
    accumulating solid particulate or powder reaction byproduct in the secondary containment chamber; and
    allowing the gas flow to exit the secondary reaction zone into a downstream exhaust line.

84. The method of claim 83, including periodically or intermittently isolating the primary and secondary reaction chambers from the process gas flow and vacuuming out the solid particulate or powder reaction byproduct accumulated in the primary containment chamber.

85. The method of claim 83, including reacting the process gas with the treatment reactant gas in a non-combustible manner.

* * * * *